United States Patent
Tsukamoto et al.

(10) Patent No.: US 6,218,975 B1
(45) Date of Patent: Apr. 17, 2001

(54) INTERLEAVED AUTO-ZERO ANALOG-TO-DIGITAL CONVERTER WITH SWITCHING NOISE COMPENSATION

(75) Inventors: Sanroku Tsukamoto; Katsumi Andou, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/046,679

(22) Filed: Mar. 24, 1998

(30) Foreign Application Priority Data

Sep. 2, 1997 (JP) .................................................. 9-237324

(51) Int. Cl.[7] .............................. H03M 1/36; H03M 1/06
(52) U.S. Cl. .............................. 341/159; 341/118; 327/65
(58) Field of Search .................................. 341/159, 118, 341/158, 120; 327/65

(56) References Cited

U.S. PATENT DOCUMENTS

| | | | |
|---|---|---|---|
| 5,194,867 | * | 3/1993 | Fisher .................................... 341/159 |
| 5,349,354 | * | 9/1994 | Ito et al. ............................ 341/159 X |
| 5,459,465 | * | 10/1995 | Kagey .................................. 341/156 |

FOREIGN PATENT DOCUMENTS

| | | |
|---|---|---|
| 5-335957 | 12/1993 | (JP) . |
| 8-293795 | 11/1996 | (JP) . |
| 1762409 | * 9/1992 | (SU) . |

OTHER PUBLICATIONS

Tsukamoto et al, "A CMOS 6–b 200 MSample/s, 3 V–Supply A/D Converter for a PRML Read Channel LSI," IEEE, 1831–1836, Nov. 1996.*
Baggini et al, "Accurate Low–Power CMOS Autozeroed Comparator," Electronic Letters, 916–918, May 1992.*
Heuner et al, "Processing and Circuit Design Enhance a Data Converter's Radiation Tolerance," IEEE, 1552–1556. Dec. 1988.*

* cited by examiner

Primary Examiner—Patrick Wamsley
(74) Attorney, Agent, or Firm—Arent Fox Kintner Plotkin & Kahn, PLLC

(57) ABSTRACT

An interleaved auto-zero analog-to-digital converter includes chopper comparators for comparing an analog input signal to predetermined voltage values. An additional chopper comparator is included for performing the comparison function of a chopper comparator undergoing an auto zero operation.

19 Claims, 21 Drawing Sheets

INTERLEAVED AUTO-ZERO ANALOG-TO-DIGITAL CONVERTER WITH SWITCHING NOISE COMPENSATION

FIELD OF THE INVENTION

The present invention relates to an analog-to-digital converter which converts an analog signal to a digital signal, and more particularly, an IAZ (Interleaved Auto-Zero) analog-to-digital converter.

BACKGROUND OF THE INVENTION

A parallel analog-to-digital converter comprises a plurality of comparators for comparing an analog signal with an analog reference voltage, and an encoder for converting the signals output from the comparators to a digital signal.

The parallel analog-to-digital converter is superior to other types of analog-to-digital converters in terms of the analog-to-digital conversion speed. FIG. 1 shows a first conventional parallel analog-to-digital converter which produces two output bits. Four resistors R are connected in series between a high-potential reference voltage VRH and a low-potential reference voltage VRL. The resistance value of the resistor at each end is set to one-half that of the other resistor.

Each of the nodes among the resistors is connected to one of two input terminals of each of three comparators CM1 to CM3. Reference voltages VR1 to VR3 (which are obtained by division of the voltage difference between the reference voltages VRH and VRL by the resistances of the resistors R) are input, respectively, to the comparators CM1 to CM3. An analog input signal Vin is input to the other input terminal of each of the comparators CM1 to CM3. The comparators CM1 to CM3 compare, respectively, the reference voltages VR1 to VR3 with the analog input signal Vin. When the analog input signal Vin has a potential higher than the corresponding reference voltage VR1 to VR3, the comparators CM1 to CM3 output, respectively, high-level output signals SG1 to SG3. In contrast, when the analog input signal Vin has a potential lower than the corresponding reference voltage VR1 to VR3, the comparators CM1 to CM3 output, respectively, low-level output signals SG1 to SG3.

If the analog input signal Vin has a potential higher than the reference voltage VR2 and a potential lower than the reference voltage VR3, the comparators CM1 and CM2 output the output signals SG1 and SG2 high, and the comparator CM3 outputs the output signal SG3 low. The output signals SG1 to SG3 form a thermometer code.

An encoder 3 receives the signals SG1 to SG3 and outputs two bits of digital output signals D0, D1. A control circuit 4 controls the timing of the comparators CM1 to CM3 and the encoder 3.

To ensure the accuracy of conversion regardless of a variation in the characteristics of the underlying transistors of the circuit, the comparators CM1 to CM3 preferably comprise, respectively, chopper type comparators. In the case of a CMOS comparator, an input offset voltage varies from comparator to comparator because of a variation in the characteristics of the MOS transistors. Such comparators produces an insufficiently accurate comparison result because of the variance in the input offset voltage.

FIG. 2 is a circuit diagram of the chopper type comparator. The input terminals, which receive the analog input signal Vin and the reference voltage VR, are connected to a node N1 (first terminal of a capacitor 1) via switching circuits SW1 and SW2. The switching circuits SW1 and SW2 are turned on in response to the control signals C1 and /CZ high. The second terminal of the capacitor 1 (a node N2) is connected to an input terminal of an inverter circuit 2a. Input and output terminals of the inverter circuit 2a are connected to each other via a switching circuit SW3. The switching circuit SW3 is turned on in response to the control signal CZ high.

In an auto-zero operation, the input and output terminals of the inverter circuit 2a are reset to a threshold value of the inverter circuit 2a. The output terminal of the inverter circuit 2a is connected to an input terminal of an inverter circuit 2c via an inverter circuit 2b and a switching circuit SW4. The switching circuit SW4 is turned on in response to the control signal /CF high. The signal output from the inverter circuit 2c is inverted by an inverter circuit 2e and output as a signal OUT. Further, the signal output from the inverter circuit 2c is fed back to the inverter circuit 2c via an inverter circuit 2d and a switching circuit SW5. The switching circuit SW5 is turned on in response to the control signal CF high.

The operation of the chopper type comparator will be described with reference to FIG. 3. First, when the control signal C1 goes high, and the control signal /CZ goes low, through the auto-zero operation, the node N2 is reset to the threshold value of the inverter circuit 2a, so that a charging current flows into the capacitor 1, thereby increasing the potential of the node N1 to the reference voltage VR. Subsequently, when the control signal C1 goes low, and the control signals /CZ and /CF go high, the analog input signal Vin is compared with the reference voltage VR. If the analog input signal Vin has a potential higher than the reference voltage VR, the potential of the node N2 becomes higher than the threshold value of the inverter circuit 2a as a result of capacitive coupling of the capacitor 1. In contrast, if the potential of the analog input signal Vin is lower than the reference voltage VR, the potential of the node N2 becomes lower than the threshold value of the inverter circuit 2a. Since the switching circuit SW4 is turned on at this time, the signal output from the inverter circuit 2a is provided to the inverter circuit 2c via the inverter circuit 2b and the switching circuit SW4. The signal output from the inverter circuit 2c is output as the signal OUT via the inverter circuit 2e.

Next, when the control signal C1 goes high again, and the control signals /CZ and /CF go low, the potential of the node N1 is reset to the reference voltage VR. Through the auto-zero operation performed by the inverter circuit 2a, the potential of the node N2 is reset to the threshold value of the inverter circuit 2a. At this time, the switching circuit SW5 is turned on, so that the inverter circuits 2c and 2d form a latch circuit which latches the signal OUT.

The chopper type comparator alternately performs the auto-zero operation and the comparing operation. Accordingly, one-half of the time required for the converting operation is spent on the auto-zero operation, thereby decreasing the conversion speed. Increasing the frequencies of the control signals C1, CZ, /CZ, CF, and /CF makes it difficult to perform the auto-zero operation and the comparing operation. Accordingly, it is not easy to increase the conversion speed of analog-to-digital conversion by increasing the frequencies of the control signals C1, CZ, /CZ, CF, and /CF.

If the number of comparators is increased in order to increase the number of bits of the digital output signal, noise is apt to arise in the reference voltage VR, the analog input signal Vin, and the power source which causes erroneous operation of the comparator. At the time of the auto-zero operation a charge/discharge current simultaneously flows between the reference voltage VR and the capacitor C1, and the input and output terminals of the inverter circuit 2a are concurrently reset to the threshold value. Consequently, a through current simultaneously flows through the inverter circuits 2a. Furthermore, at the time of the comparing operation, a charge/discharge current simultaneously flows between the analog input signal Vin and of each of the capacitors 1.

To increase the conversion speed of the chopper type comparator, a technique of controlling the control signals C1, CZ, /CZ, CF, and /CF at the timing shown in FIG. 4 has been proposed. More specifically, after the auto-zero operation, the control signals C1, CZ, and /CZ are maintained in the state of a comparing operation, and the control signals CF and /CF are inverted several times to thereby sample, e.g., analog input signals VA and VB. As a result, the comparing operation is performed several times on the basis of one auto-zero operation. This is because the comparing operation can be performed several times until the electric charge stored in the capacitor 1 during the auto-zero operation discharges completely. The ratio of the time required for the comparing operation to the time required for the auto-zero operation is increased, the conversion speed is increased.

However, there still remains the need for separate time required by all the comparators to simultaneously perform the auto-zero operation, and the noise caused at the time of the auto-zero operation is not prevented. Furthermore, the number of times of the comparing operation is limited.

Japanese Patent Application Laid-Open No. 8-293795 describes an IAZ (Interleaved Auto-Zero) analog-to-digital converter having four chopper type comparators which output e.g., digital output signals D1 and D0. The four comparators are selected in turn one at a time and caused to perform the auto-zero operation, while the comparison operation is performed by each of the other three comparators. Each comparator performs the comparing operation several times on the basis of one auto-zero operation. Since the analog-to-digital converter performs the auto-zero operation in parallel with the comparing operation, the operating speed is increased. Since the comparators do not all perform the auto-zero operations simultaneously, the noise resulting from the auto-zero operation is suppressed.

However, in the IAZ analog-to-digital converter, switching noise, which occurs when each of the comparators proceeds from the comparing operation to the auto-zero operation, causes an error in the comparing operation performed immediately before auto-zero operation. Furthermore, switching noise, which occurs when each of the comparators proceeds from the auto-zero operation to the comparing operation, causes an error in the comparing operation performed immediately after the auto-zero operation. Furthermore, when the comparators each proceed to the auto-zero operation from the comparing operation, the comparators may fail to latch and output the result of the comparison performed immediately before the auto-zero operation. Further, the limitation on the response speed of the comparator itself with respect to the switching from the reference voltage to the analog input signal does not provides an accurate comparison result obtained by the comparing operation immediately after the auto-zero operation. These problems degrade the error rate of the analog-to-digital converter when the respective comparator is operated at high speed.

SUMMARY OF THE INVENTION

The object of the present invention is to provide an IAZ analog-to-digital converter which provides improved error rate and operating speed.

Briefly stated, the present invention provides an analog-to-digital converter including a plurality of chopper type comparators, a controller circuit and an encoder. Each of the plurality of chopper type comparators receives a reference voltage and an analog voltage and performs an auto-zero operation for setting the reference voltage and a comparing operation for comparing the reference voltage set by the auto-zero operation with the analog voltage to output a comparison result signal. The comparing operation is performed a plurality of times subsequent to the auto-zero operation. The controller circuit is coupled to the plurality of chopper type comparators and controls one comparator to perform the auto-zero operation and the remaining comparators to perform the comparing operations, substantially simultaneously. The controller circuit selectively outputs the comparison result signals output from the remaining comparators. The encoder is coupled to the controller circuit and receives the comparison result signals and generating a digital signal therefrom. The controller circuit includes a signal selector circuit for switching a first comparison result signal output from a first comparator performing the comparing operation before or after the auto-zero operation to a second comparison result signal output from a second comparator performing the comparing operation using the same reference voltage as the first comparator.

The present invention provides an analog-to-digital (A/D) converter for converting an analog input signal into a digital signal. The converter includes a plurality of chopper type comparators, a controller circuit and an encoder. Each of the plurality of chopper type comparators receives and compares a reference voltage and the analog input signal to generate a comparator output signal and performs an auto-zero operation to set the reference voltage. The controller circuit is connected to the plurality of comparators and causes a selected one of the comparators to perform the auto-zero operation and the remaining, nonselected comparators to perform the comparing operation. The encoder is connected to the control circuit and the comparators and receives the output signals from the nonselected comparators and generating the digital signal therefrom. The selected comparator does not provide its comparison output signal to the encoder for at least one cycle after completing the auto-zero operation.

The present invention provides an analog-to-digital (A/D) converter for converting an analog input signal into a digital signal. The converter includes a plurality of chopper type comparators, a controller circuit and an encoder. Each of the plurality of chopper type comparators receives and compares a reference voltage and the analog input signal to generate a comparator output signal and performs an auto-zero operation to set the reference voltage. The controller circuit is connected to the plurality of comparators and causes a selected one of the comparators to perform the auto-zero operation and the remaining, nonselected comparators to perform the comparing operation. One of the nonselected comparators performs its comparing operation using the same reference voltage set for the selected comparator by the auto-zero operation. The encoder is connected to the control circuit and the comparators and receives the output signals from the nonselected comparators and generates the digital signal therefrom. The selected comparator does not provide its comparison output signal to the encoder for at least two cycles after completing the auto-zero operation.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
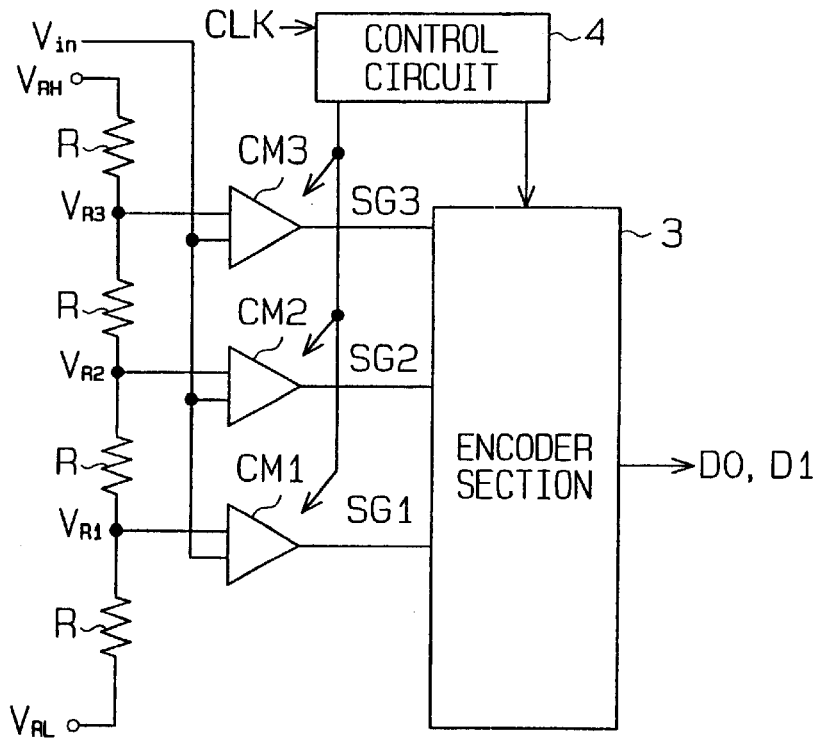
FIG. 1 is a circuit diagram of a conventional parallel analog-to-digital converter.
Figure 2:
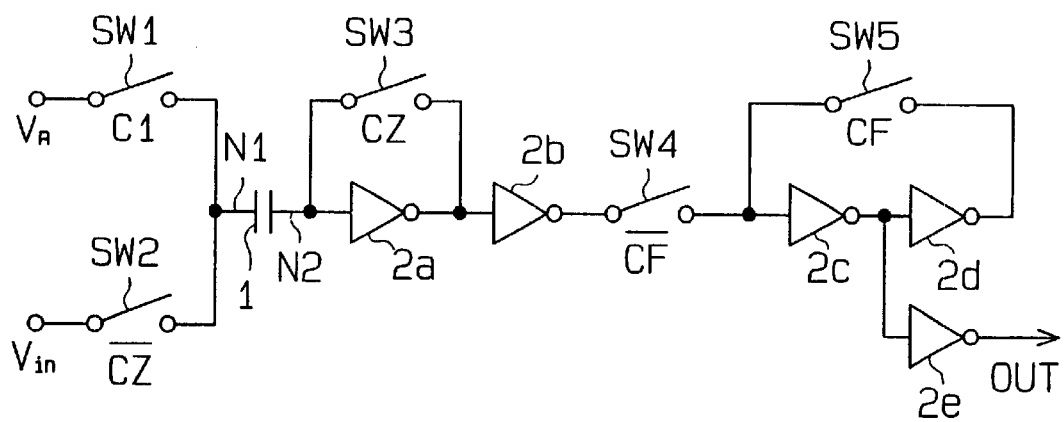
FIG. 2 is a circuit diagram of a conventional chopper comparator.
Figure 3:
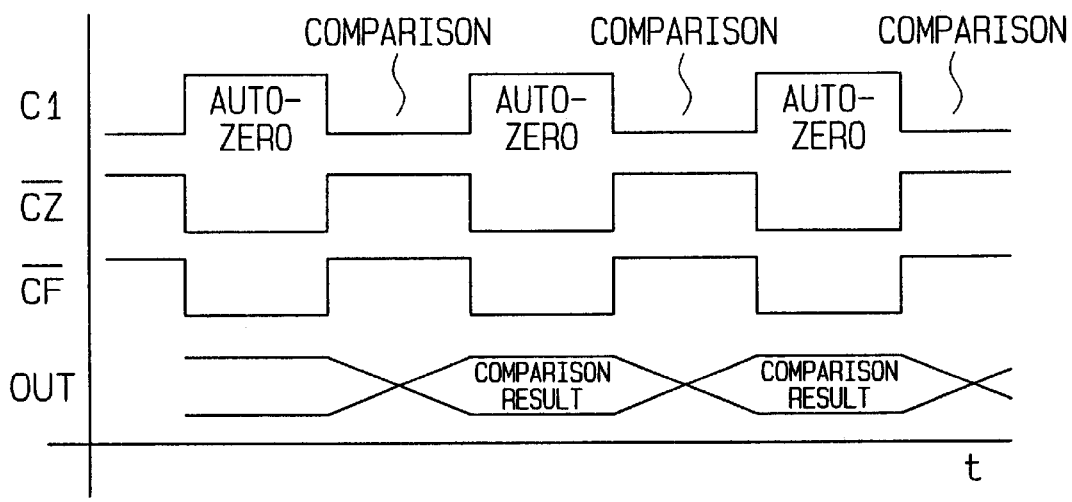
FIG. 3 is a timing chart of the operation of the conventional chopper comparator of FIG. 2.
Figure 4:
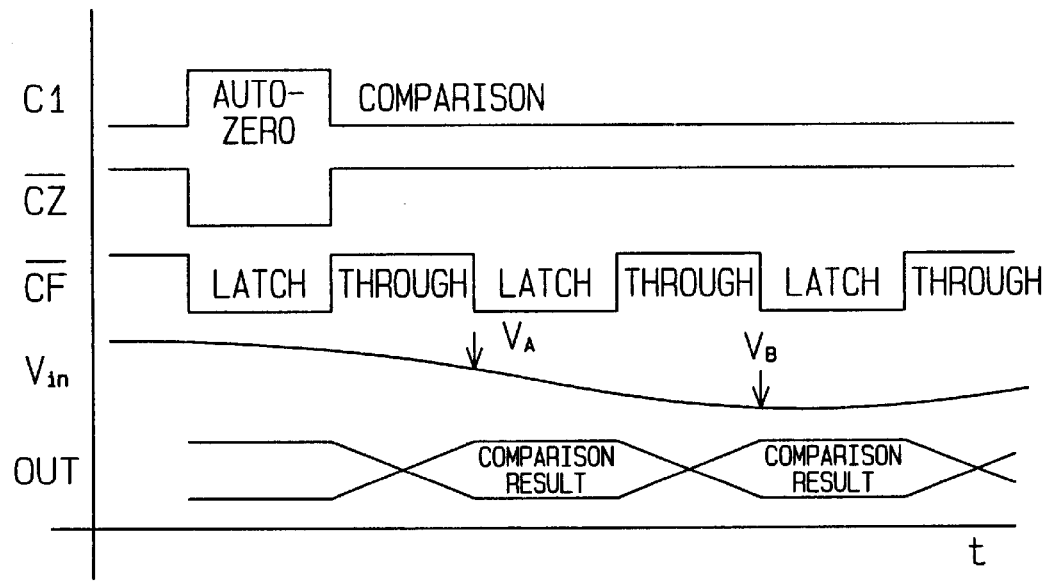
FIG. 4 is a timing chart of the operation of a modified conventional chopper comparator.
Figure 5:
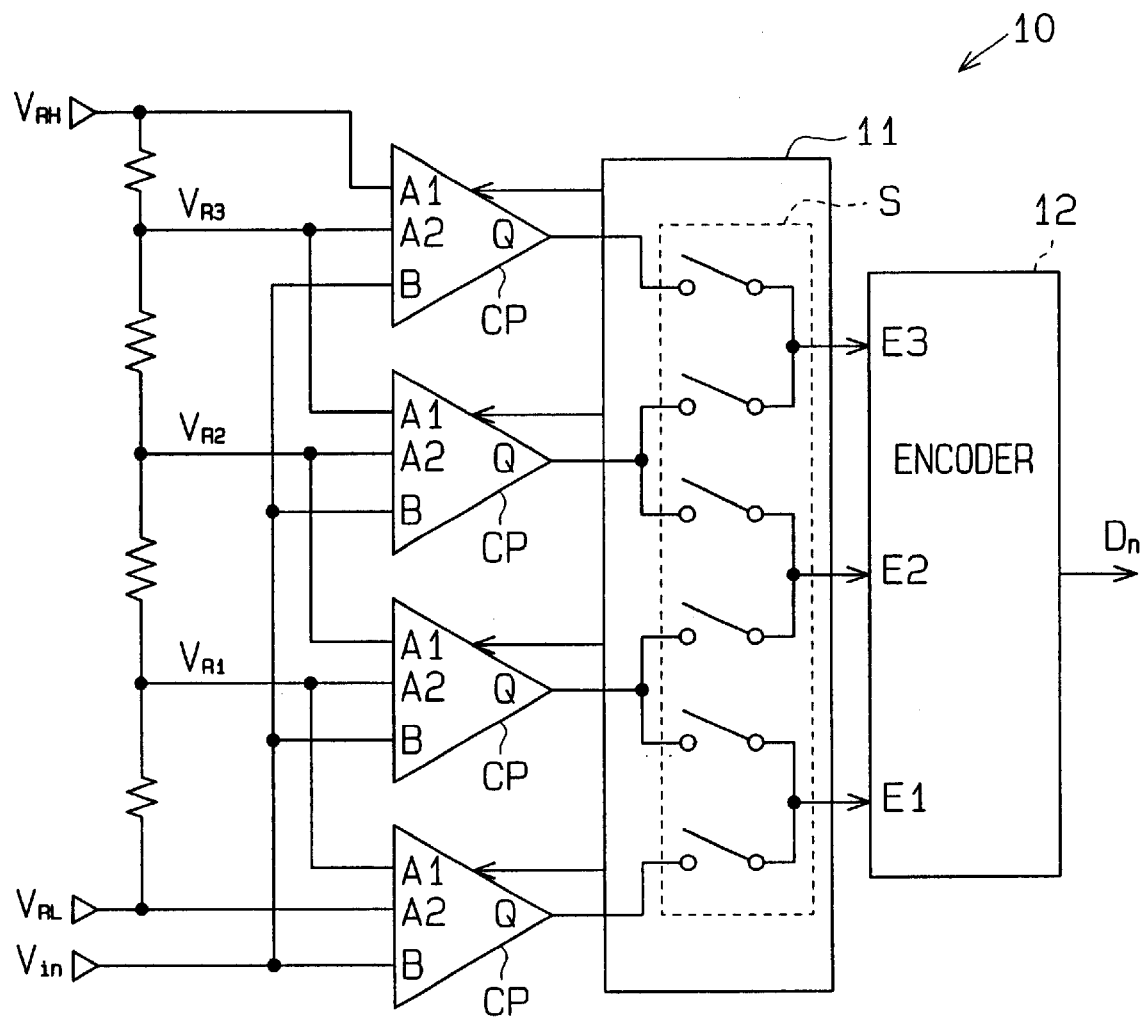
FIG. 5 is a circuit diagram of an analog-to-digital converter according to the present invention.

FIG. 5 is a block diagram schematically showing an analog-to-digital converter 10 according to the present invention. Each of a plurality of chopper comparators CP performs an auto-zero operation by receiving an input reference voltage VRn and a comparing operation for comparing the reference voltage VRn input at the time of the auto-zero operation with an analog input signal Vin. Subsequent to an auto-zero operation, the comparing operation is performed a plurality of times. A control section 11 performs a control operation to sequentially carry out the auto-zero operation of the plurality of comparators CP and control the timing of the comparing operation and the auto-zero operation, and the setting of the reference voltage VR at the time of the comparing operation. Further, the control section 11 receives the signals output from the comparators and outputs selected signals. The encoder 12 receives the selected signals output from the control section 11 and generates a digital signal Dn. The control section 11 comprises a signal selection circuit S which switches at least one of the comparing output signals output before and after the auto-zero operations of the respective comparators CP to the comparing signal output from a comparator CP which performs the comparing operation at the same reference voltage VR.

(First Embodiment)

Figure 6:
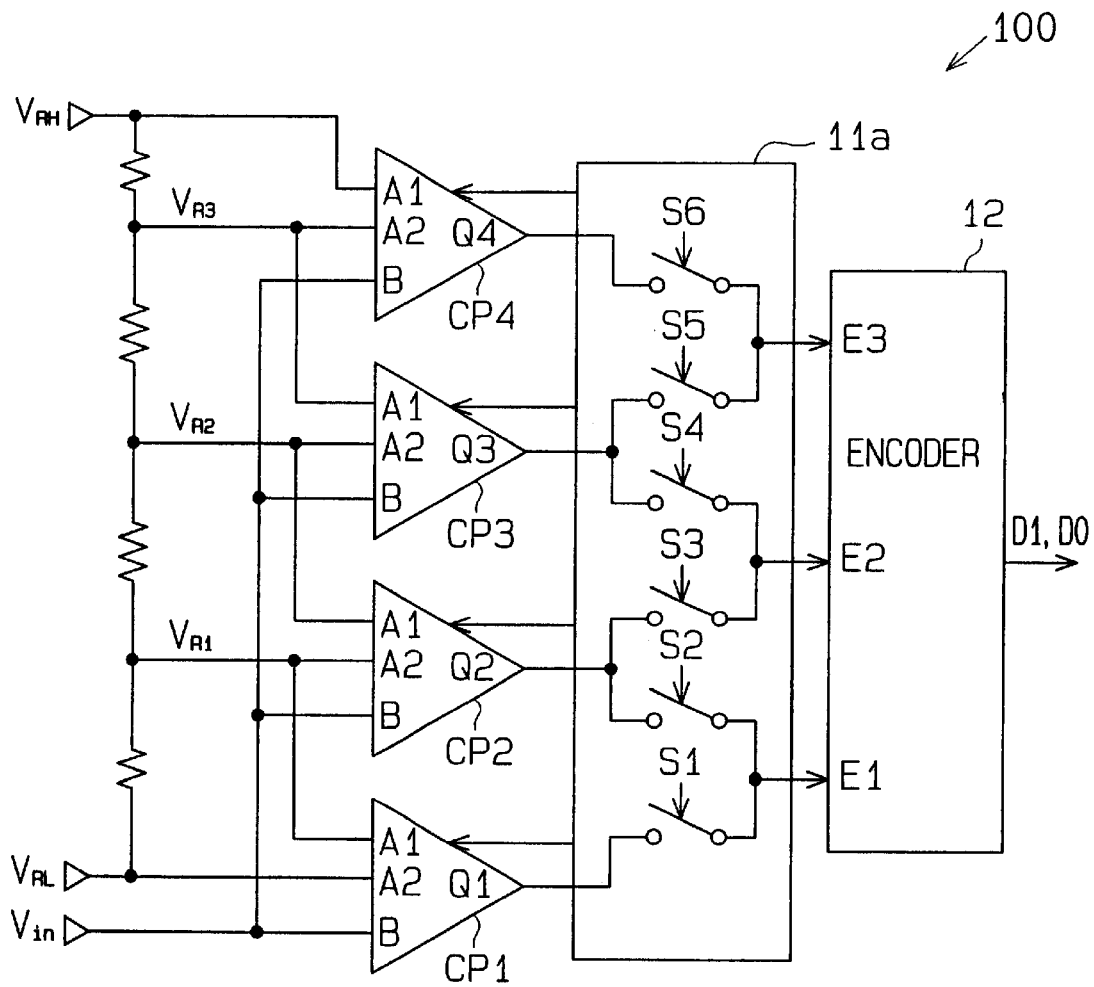
FIG. 6 is a circuit diagram of an analog-to-digital converter according to a first embodiment of the present invention.

FIG. 6 shows an improved IAZ type analog-to-digital converter 100 according to a first embodiment of the present invention. The analog-to-digital converter 100 comprises four chopper comparators CP1 to CP4 for converting an analog input signal Vin to two bits of digital output signals D1 and D2. Four resistors R are connected in series between a high-potential reference voltage VRH and a low-potential reference voltage VRL. The resistance value of the resistor R at each end is set to one-half that of the other resistor, thereby producing reference voltages VR1 to VR3 which are equal to the result of division of the voltage difference between the reference voltages VRH and VRL by the resistances of the resistors R.

The analog input signal Vin is input to an input terminal B of each of the comparators CP1 to CP4. Each of the comparators CP1 to CP4 has another two input terminals A1 and A2 for receiving the reference voltages. In the comparator CP1, the input terminal A2 receives the reference voltage VRL, and the input terminal A1 receives the reference voltage VR1. In the comparator CP2, the input terminal A2 receives the reference voltage VR1, and the input terminal A1 receives the reference voltage VR2. In the comparator CP3, the input terminal A2 receives the reference voltage VR2, and the input terminal A1 receives the reference voltage VR3. In the comparator CP4, the input terminal A2 receives the reference voltage VR3, and the input terminal A1 receives the reference voltage VRH.

Figure 7:
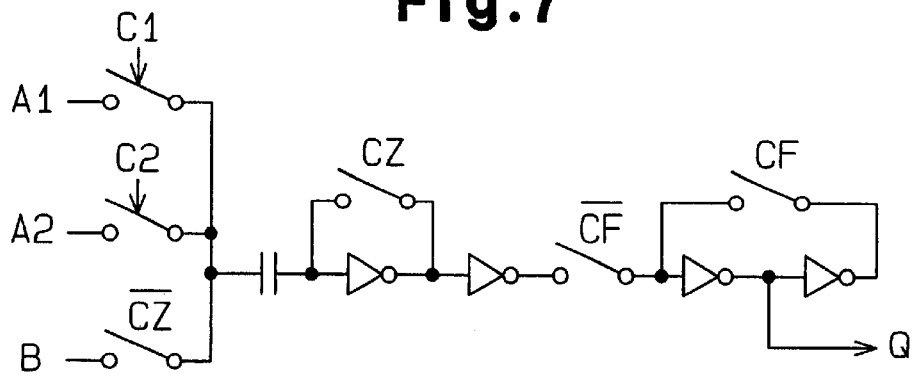
FIG. 7 is a circuit diagram of a chopper comparator of the converter of FIG. 6.

FIG. 7 is a circuit diagram of each of the comparators CP1 to CP4. Each of the comparators CP1 to CP4 has switching circuits for selecting one of the reference voltages input to the input terminals A1 and A2 in response to control signals C1 and C2. Signals Q1 to Q4 are provided from the comparator CP1 to CP4 to a control section 11a. The control section 11a selects three of the output signals Q1 to Q4 and causes the associated three comparators to perform a comparing operation. The control section 11a also causes the remaining, nonselected comparator to perform an auto-zero operation. Signals Q output from the selected comparators are provided to the encoder 12 as signals E1 to E3. In FIG. 6, the signal selection circuit 11a is schematically shown as a plurality of switches which are turned on when a corresponding one of a plurality of selection signals S1 to S6 goes high. The encoder 12 receives a thermometer code E1 to E3 output from the control section 11a and produces two bits of digital output signals D1 and D0.

Figure 16:
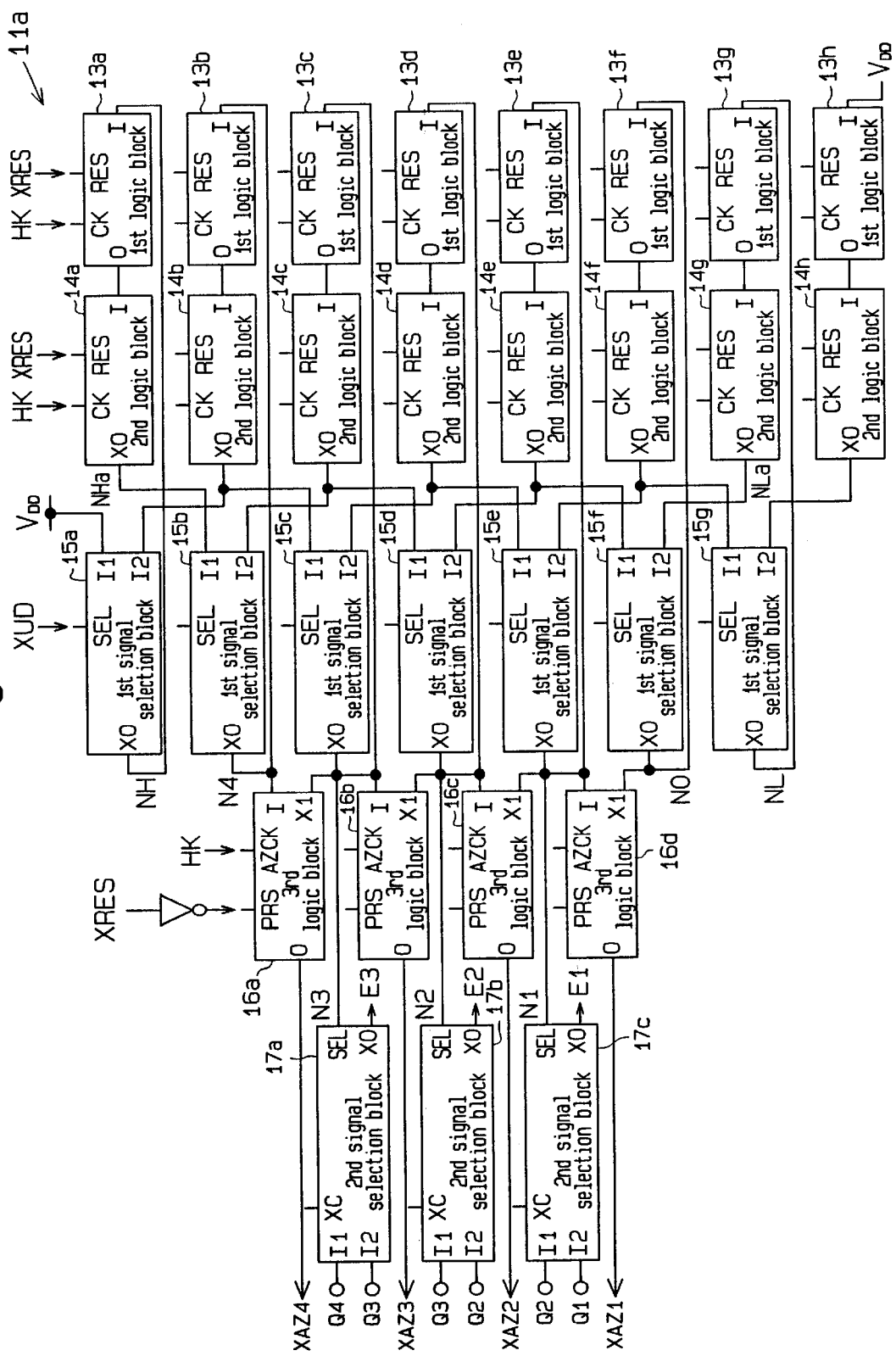
FIG. 16 is a block diagram of a control section of the analog-to-digital converter of FIG. 6 according to the first embodiment.
Figure 18:
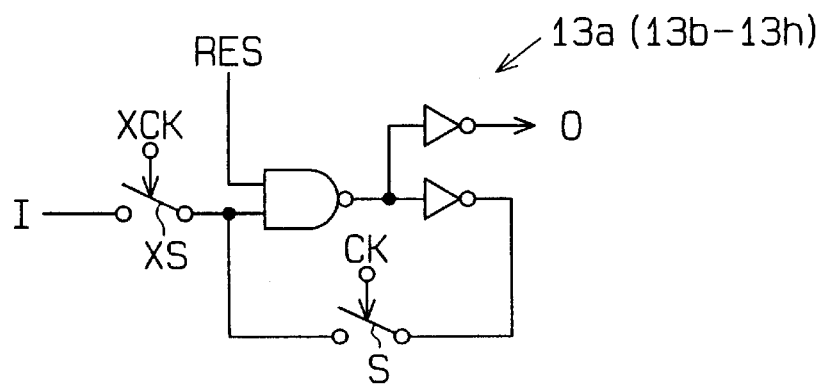
FIG. 18 is a circuit diagram of a first logic block in the control section of FIG. 16.

With reference to FIG. 16, the specifics of the control section 11a will be described. The control section 11a comprises first logic blocks 13a to 13h, second logic blocks 14a to 14h, third logic blocks 16a to 16d, first signal selection blocks 15a to 15g, second signal selection blocks 17a to 17c. As shown in FIG. 18, each of first logic blocks 13a to 13h comprises an input terminal I for receiving an input signal, a reset signal input terminal RES, a clock signal input terminal CK, an output terminal O, a NAND gate, a pair of inverter circuits, and switching circuits S and XS. The clock signal input terminal CK receives a clock signal HCK whose frequency is one-twelfth of that of the clock signal CLK used for driving the comparator CP0 to CP4.

When the clock signal HCK goes high, the switching circuit S is turned on. In contrast, the switching circuit XS is turned on when the clock signal HCK goes low. The reset signal input terminal RES receives a reset signal XRES (see FIG. 26) from an external device (not shown).

Figure 19:
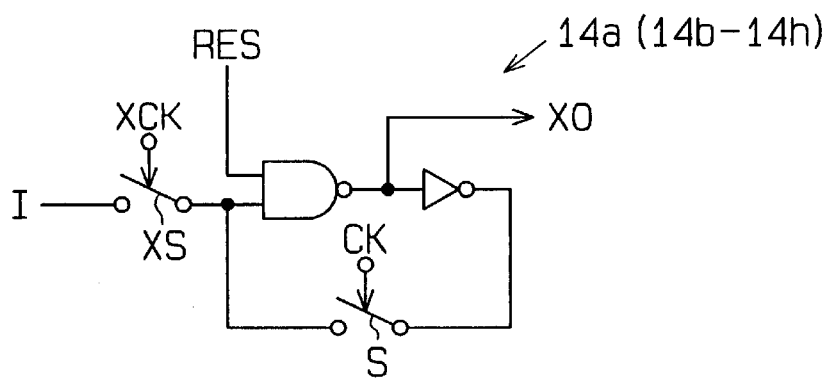
FIG. 19 is a circuit diagram of a second logic block in the control section of FIG. 16.

As shown in FIG. 19, each of the second logic blocks 14a to 14h comprises an input terminal I for receiving an input signal, a reset signal input terminal RES, a clock signal input terminal CK, an output terminal XO, a NAND gate, an inverter circuit, and switching circuits S and XS which are switched by the clock signal HCK input to the clock signal input terminal CK. When the clock signal HCK goes high, the switching circuit S is turned on. In contrast, the switching circuit XS is turned on when the clock signal HCK goes low.

Figure 20:
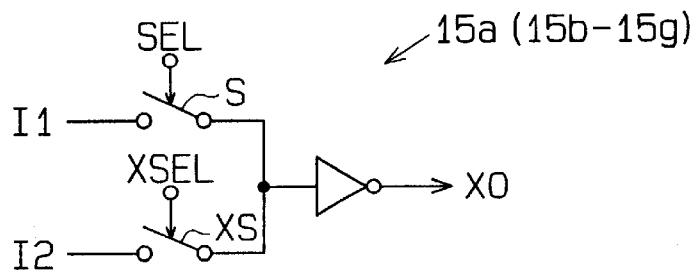
FIG. 20 is a circuit diagram of a first signal selection block in the control section of FIG. 16.

As shown in FIG. 20, each of the first signal selection blocks 15a to 15h comprises two input terminals I1 and I2, a selection signal input terminal SEL, an output terminal XO, two switching circuits S and XS, and an inverter circuit. The switching circuit S is turned on when a selection signal XUD input to the selection signal input terminal SEL from the external device goes high. The switching circuit XS is turned on when the selection signal XUD goes low. Each of the first signal selection blocks 15a to 15g inverts either of the signals input to the input terminals I1 and I2 in response to the selection signal XUD and outputs the inverted signal from the output terminal XO.

Figure 17:
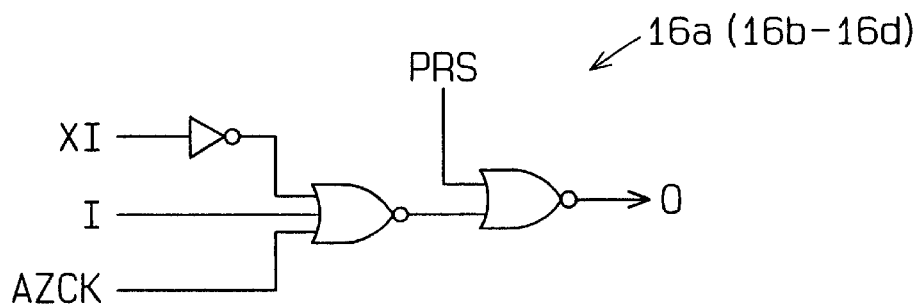
FIG. 17 is a circuit diagram of a third logic block in the control section of FIG. 16.
Figure 26:
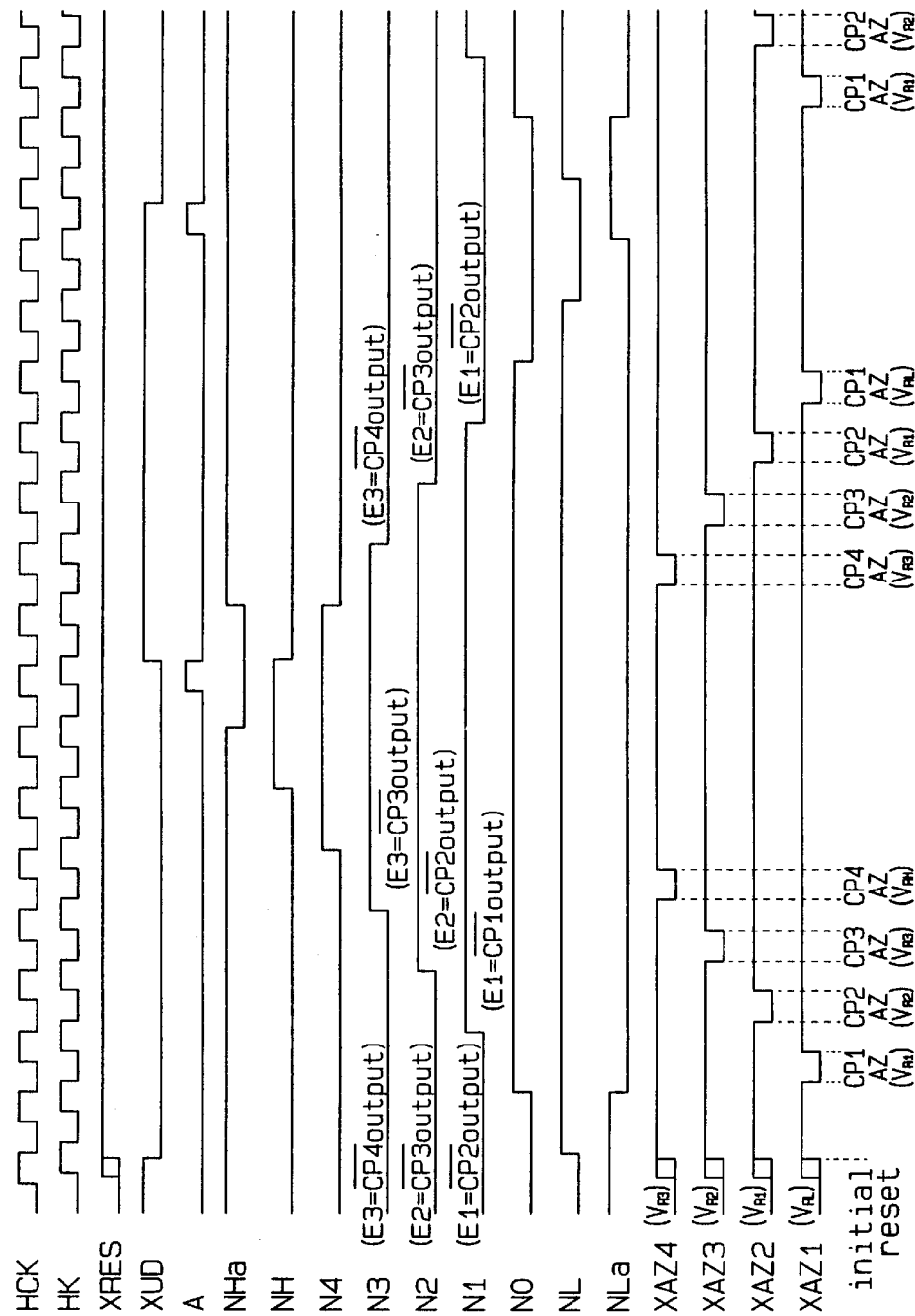
FIG. 26 is a timing chart of the operation of the control section of FIG. 16.

As shown in FIG. 17, each of the third logic blocks 16a to 16d comprises input terminals I and XI, an output terminal O, a reset signal input terminal PRS, an auto-zero clock signal input terminal AZCK, an inverter circuit, and two NOR gates. The reset signal input terminal PRS receives an inverted signal of the reset signal XRES. The auto-zero clock signal input terminal AZCK receives a clock signal HK which differs from the clock signal HCK in at least the timing of a leading edge or a trailing edge, as shown in FIG. 26.

Figure 21:
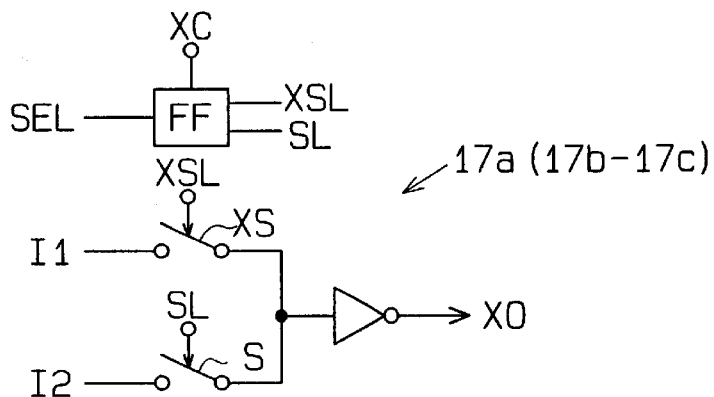
FIG. 21 is a circuit diagram showing a second signal selection block in the control section of FIG. 16.

As shown in FIG. 21, each of the second signal selection blocks 17a to 17c comprises two input terminals I1 and I2, a selection signal input terminal SEL, an output terminal XO, a clock signal input terminal XC, two switching circuits S and XS, an inverter circuit, and a flip-flop circuit FF. The switching circuit S is turned on when a selection signal SL goes high, and the switching circuit XS is turned on when the selection signal XSL goes low. The flip-flop circuit FF latches a selection signal SEL according to the trailing edge of the clock signal XC and outputs the latched signal as the signal SL. Further, the flip-flop circuit FF outputs an inverted signal of the selection signal SEL as the signal XSL. Each of the second signal selection blocks 17a to 17c inverts either of the signals input to the input terminals I1 and I2 in response to the selection signal SEL and outputs the inverted signal from the output terminal XO.

As shown in FIG. 16, the input terminals I1 and I2 of the second signal selection block 17a receive signals Q3 and Q4 output from the comparators CP3 and CP4, respectively. The input terminals I1 and I2 of the second signal selection block 17b receive signals Q2 and Q3 output from the comparators CP2 and CP3. Further, the input terminals I1 and I2 of the second signal selection block 17c receive signals Q1 and Q2 from the comparators CP1 and CP2.

Figure 22:
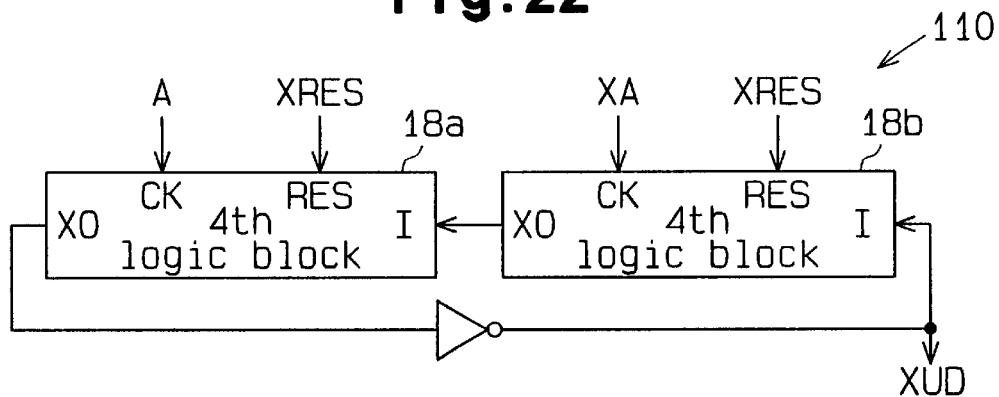
FIG. 22 is a block diagram showing a first signal generation circuit connected to the control section of FIG. 16.

FIG. 22 shows a signal generation circuit 110 which is connected to the control section 11a. The signal generation circuit 110 produces the control signal XUD in response to control signals A and XA and the reset signal XRES. The signal generation circuit 110 comprises two fourth logic blocks 18a and 18b connected to an inverter circuit in a ring shaped configuration. The control signal XUD is output from the inverter circuit and input to the fourth logic block 18b.

Figure 24:
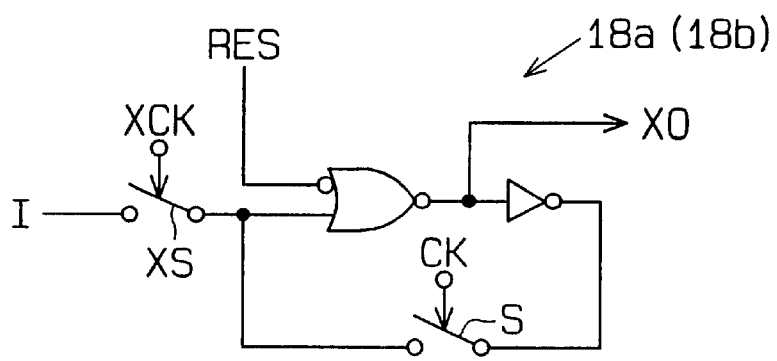
FIG. 24 is a circuit diagram showing a fourth logic block of the signal generation circuit of FIG. 22.

As shown in FIG. 24, each of the fourth logic blocks 18a and 18b comprises an input terminal I for receiving an input signal, a reset signal input terminal RES receiving the reset signal XRES from the external device, a clock signal input terminal CK, an output terminal XO, a NOR gate, an inverter circuit, and switching circuits S and XS switched by the control signal A, which is input to the clock signal input terminal CK.

In the fourth logic block 18a, the switching circuit S is turned on when the control signal A goes high, and the switching circuit XS is turned on when the control signal A goes low. In the fourth logic block 18b, the switching circuit S is turned on when the control signal XA goes high, and the switching circuit XS is turned on when the control signal XA goes low.

Figure 23:
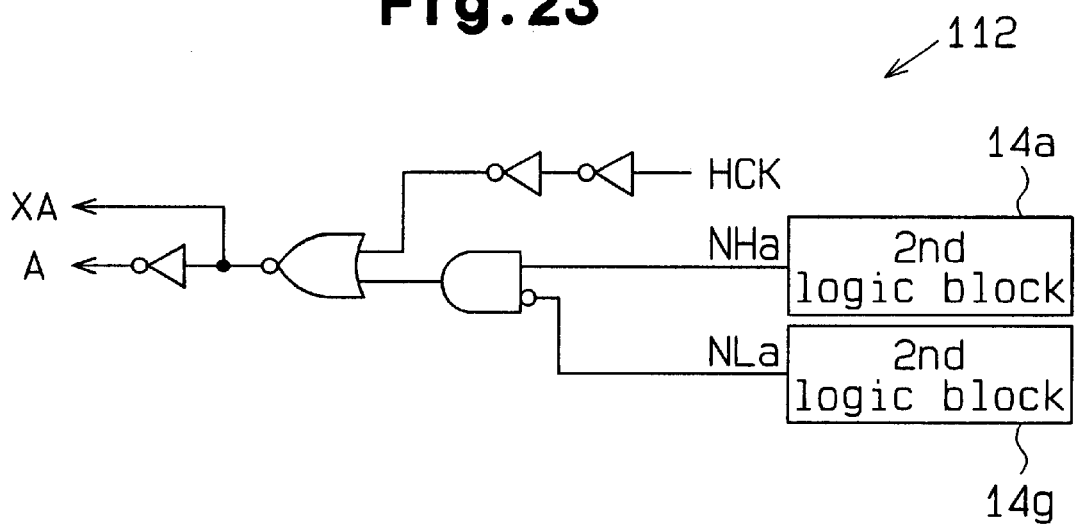
FIG. 23 is a circuit diagram showing a second signal generation circuit connected to the control section of FIG. 16.

FIG. 23 shows a second signal generation circuit 112 which is connected to the control section 11a. The second signal generation circuit 112 receives the clock signal HCK, a signal NHa output from the second logic block 14a, and a signal NLa output from the second logic block 14g. The second signal generation circuit 112 comprises four inverter circuits, an AND gate, and a NOR gate and produces the control signals A and XA, which is the reverse of the control signal A.

The control section 11 outputs thermometer codes signals E1 to E3. Specifically, a signal NH is output from the first signal selection block 15a, and a signal NL is output from the first signal selection block 15g. A signal NO is provided to the first and third logic blocks 13f and 16d from the first signal selection block 15f, and a signal N1 is output from the first logic block 15e to the first and third logic blocks 13e, 16c, 16d and the second signal selection block 17c. A signal N2 is output from the first logic block 15d to the first and third logic blocks 13d, 16b, 16c and the second signal selection block 17b. A signal N3 is output from first the logic block 15c to the first and third logic blocks 13e, 16a, 16b and the signal selection block 17a. A signal N4 is output from the first logic block 15b to the first and third logic blocks 13b and 16a. The third logic blocks 16a to 16d output control signals XAZ1 to XAZ4 to the comparators CP1 to CP4, and the logic blocks 17a to 17c output signals E1 to E3.

The control signals XAZ1 to XAZ4 output by the third logic block 16a–16d function as the control signals CZ and /CZ used for controlling the auto-zero operations of the comparators CP1 to CP4. The second signal selection blocks 17a to 17c functions as the signal selection circuit of FIG. 6 which is switched by the control signals S1 to S6. The output signal N1 is used to generate the control signals S1, S2, which are complementary to each other. The output signal N2 is used to generate the control signals S3, S4, which are complementary to each other. The output signal N3 is used to generate the control signals S5, S6, which are complementary to each other.

Figure 25:
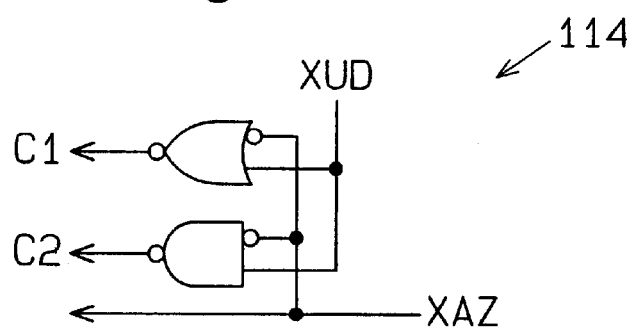
FIG. 25 is a circuit diagram showing a third signal generation circuit connected to the control section of FIG. 16.

FIG. 25 shows a third signal generation circuit 114 connected to the control section 11a. The third signal generation circuit 114 produces the control signals C1 and C2 in response to the control signals XUD, XAZ. The control signals C1 and C2 are then output to the comparators CP1 to CP4. A reverse signal of the control signal XAZ is input to a NOR gate and a NAND gate, and the control signal XUD is input to the NOR gate and the NAND gate. The NOR gate outputs the control signal C1, and the NAND gate outputs the control signal C2.

With reference to FIG. 26, the operation of the control section 11a will be described. The reset signal XRES goes low at the time of an initial resetting operation, so that the control signals XAZ1 to XAZ4 provided, respectively, to the comparators CP1 to CP4 go low. Further, the control signal XUD goes high, and the signals NL to N4 go low. Subsequently, when the control signal XUD goes low, the control signals NL to NH rise in order in every cycle of the clock signal HCK. Further, when the control signal XUD goes high, the signals NH to NL fall in order (i.e., NL, N0, N1, N2, N3, N4, NH) in every one cycle of the clock signal HCK. As a result, the control signals XAZ1 to XAZ4 sequentially go low, in order, for a period of time which is half the cycle of the clock signal HCK in every one cycle of the clock signal HCK. When each of the control signals XAZ1 to XAZ4 goes low, the each of the comparators CP1 to CP4 performs the auto-zero (AZ) operation.

The rise and fall timing of the signals NL to NH is determined by the clock signal HCK. The fall timing of the control signals XAZ1 to XAZ4 is determined by the clock signal HK. By controlling the rise and fall timing of the clock signal HK with respect to the clock signal HCK, the rise and fall timing of the signals N1 to N3 and the fall timing of the control signals XAZ1 to XAZ4 is controlled.

Figure 8:
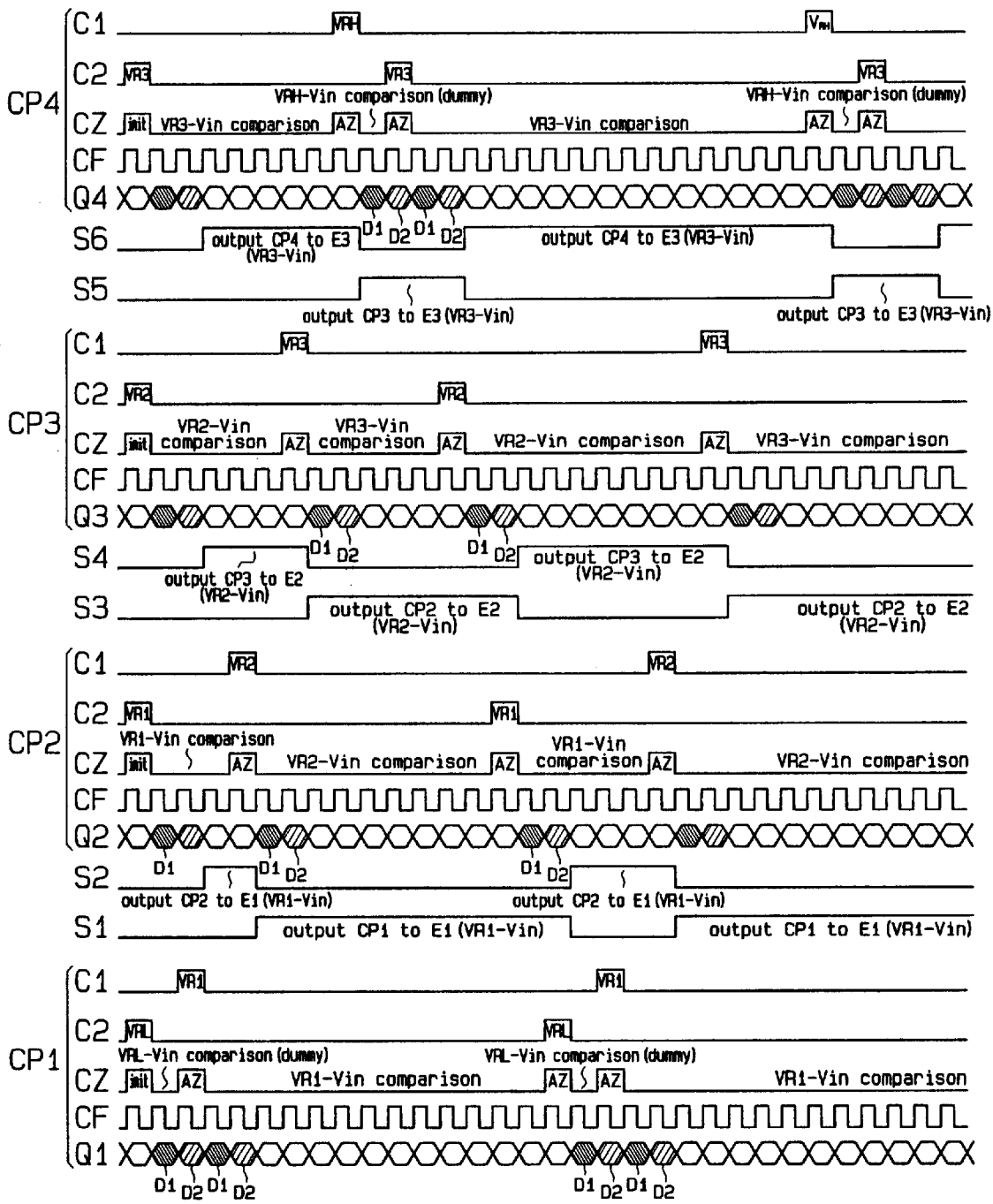
FIG. 8 is a timing chart of the operation of the analog-to-digital converter according to the first embodiment.

Subsequently, with particular reference to FIGS. 6–8, the operations of the comparators CP1 to CP4 under the control of the control section 11a will be described. The control signals S1 to S6, C1, C2, and CZ, shown in FIG. 8, are produced by the control section 11a. The control signal CF is a clock signal CLK supplied to each of the comparators CP1 to CP4 from the control section 11a. The control signals S1 to S6 are produced by causing the clock signal HK to fall prior to the trailing edge of the clock signal HCK. When the control section 11a is started, the comparators CP1 to CP4 are respectively initialized. That is, when the control signals C2 and CZ go high, the comparator CP1 performs an auto-zero operation while inputting the reference voltage VRL. The comparator CP2 performs an auto-zero operation while inputting the reference voltage VR1. The comparator CP3 performs an auto-zero operation while inputting the reference voltage VR2. The comparator CP4 performs an auto-zero operation while inputting the reference voltage VR3.

Next, when the control signal CZ goes low, each of the comparators CP1 to CP4 commences a comparing operation. At this time, the control signals S1 to S6 are maintained in a low state, thereby preventing the comparators CP1 to CP4 from outputting signals Q1 to Q4 to the encoder 12. Subsequently, after one cycle of the control signal CF, the control signals C1 and CZ of the comparator CP1 go high. The comparator CP1 performs the auto-zero operation while inputting the reference voltage VR1.

After the completion of the auto-zero operation of the comparator CP1, the control signals S2, S4, and S6 go high. As a result, the signals Q2, Q3, and Q4 are provided to the encoder 12 from the comparators CP2, CP3, and CP4. At this time, the comparator CP2 outputs the comparison result of the reference voltage VR1 and the analog input signal Vin. The comparator CP3 outputs the comparison result of the reference voltage VR2 and the analog input signal Vin. The comparator CP4 outputs the comparison result of the reference voltage VR3 and the analog input signal Vin. After the auto-zero operation of the comparator CP1, the state is maintained during two cycles of the control signal CF. Accordingly, invalid data D1 and indefinite data D2 output from the comparator CP1 after the auto-zero operation is not provided to the encoder 12. After the lapse of one cycle of the control signal CF from the auto-zero operation of the comparator CP1, the control signals C1 and CZ of the comparator CP2 go high. The comparator CP2 then performs the auto-zero operation while inputting the reference voltage VR2.

After the completion of the auto-zero operation of the comparator CP2, the control signal S2 goes low, and the control signal S1 goes high. As a result, in place of the signal Q2, the signal Q1 output from the comparator CP1 is provided as a signal E1 to the encoder 12. That is, the comparators CP1, CP3 and CP4 output the comparison results. Accordingly, the invalid data D1 and the indefinite data D2 output from the comparator CP2 after the auto-zero operation is not provided to the encoder 12.

After the lapse of one cycle of the control signal CF from the auto-zero operation of the comparator CP2, the control signals C1 and CZ of the comparator CP3 go high. The comparator CP3 then performs the auto-zero operation while inputting the reference voltage VR3. After the completion of the auto-zero operation of the comparator CP3, the control signal S4 goes low, and the control signal S3 goes high. As a result, in place of the signal Q3, the signal Q2 output from the comparator CP2 is provided as a signal E2 to the encoder 12. That is, the comparators CP1, CP2 and CP4 output the comparison results. Accordingly, the invalid data D1 and the indefinite data D2 output from the comparator CP3 after the auto-zero operation is not provided to the encoder 12.

After the lapse of one cycle of the control signal CF from the auto-zero operation of the comparator CP3, the control signals C1 and CZ of the comparator CP4 go high. The comparator CP4 then performs the auto-zero operation while inputting the reference voltage VRH. After the completion of the auto-zero operation of the comparator CP4, the control signal S6 goes low, and the control signal S5 goes high. As a result, in place of the signal Q4 output from the comparator CP4, the signal Q3 output from the comparator CP3 is provided as a signal E3 to the encoder 12. That is, the comparators CP1, CP2 and CP3 output the comparison results. Subsequently, after the lapse of one cycle of the control signal CF from the auto-zero operation of the comparator CP4, the control signals C2 and CZ of the comparator CP4 go high again. The comparator CP4 then performs the auto-zero operation while inputting the reference voltage VR3. Accordingly, the invalid data D1 and the indefinite data D2 output from the comparator CP4 after the auto-zero operation is not provided to the encoder 12. From then on, the comparators CP1 to CP3 sequentially perform the auto-zero operations in the same manner as mentioned previously, and the operations are repeated.

As discussed above, during two cycles of the control signal CF after the auto-zero operation, a signal output from the comparator is not provided to the encoder 12. A signal output from another comparator which is performing the comparing operation at the same reference voltage is output to the encoder 12. Therefore, invalid data and indefinite data output from the comparator immediately after the auto-zero operation are not provided to the encoder 12, so that the error rate of the analog-to-digital converter is improved, and a high speed analog-to-digital conversion is accurately performed.

(Second Embodiment)

Figure 9:
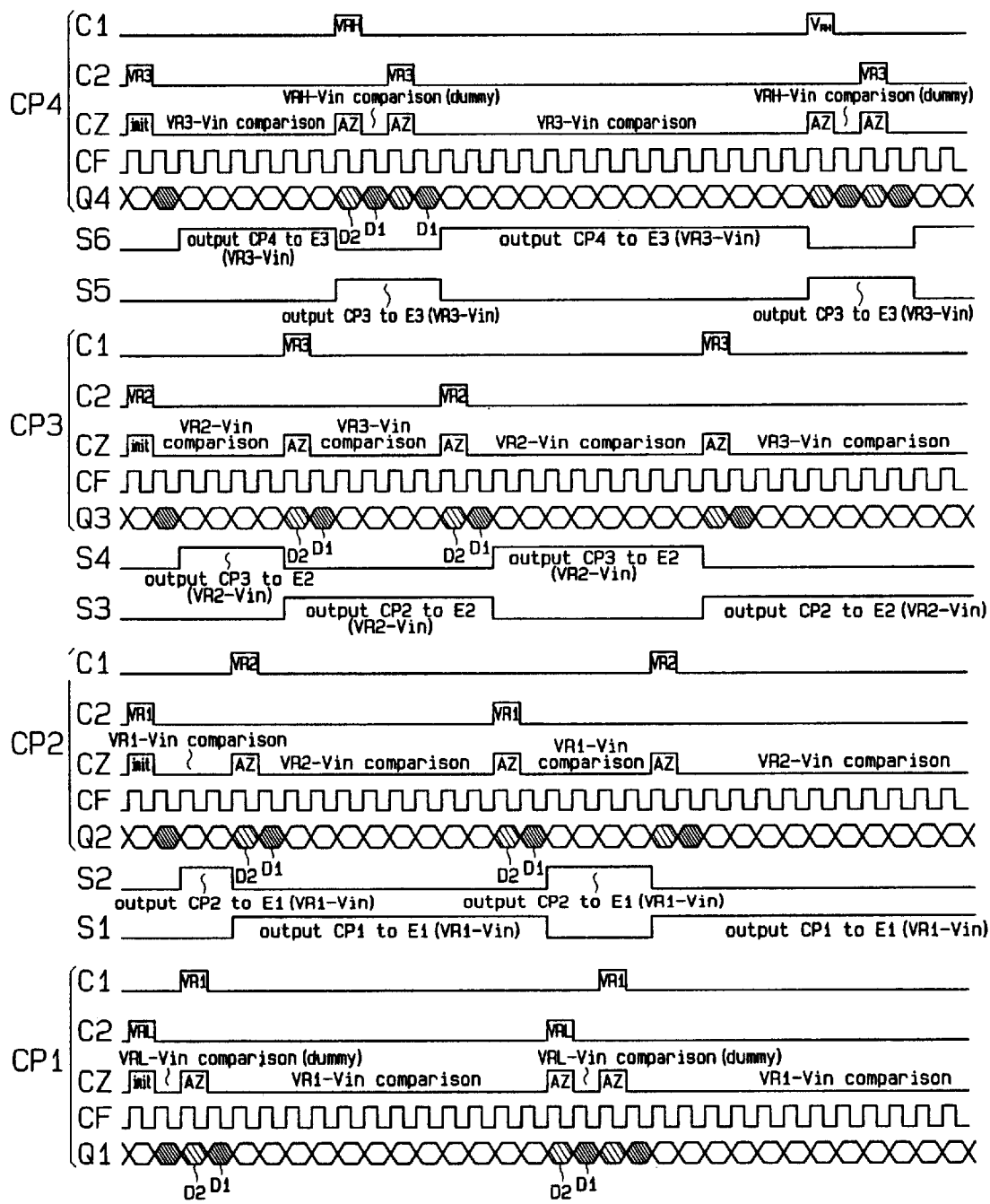
FIG. 9 is a timing chart of the operation of an analog-to-digital converter according to a second embodiment of the present invention.

FIG. 9 shows the operation of the analog-to-digital converter 100 operating according to a second embodiment of the present invention. In the second embodiment, the comparators CP1 to CP4 are selected by the control signals S1 to S6 produced in accordance with the clock signal HK high after the leading edge of the clock signal HCK.

Referring to FIG. 9, the control signals S1 to S6 are switched faster than in the first embodiment by one cycle of the control signal CF.

The control signals C1 and CZ of the comparator CP1 go high after one cycle of the control signal CF. The comparator CP1 performs the auto-zero operation while inputting the reference voltage VR1. In synchronization with the initiation of the auto-zero operation, the control signals S2, S4, and S6 go high. As a result, the comparators CP2, CP3, and CP4 output the comparison result signals Q2, Q3, and Q4 to the encoder 12. This state is maintained for two cycles of the control signal CF after initiation of the auto-zero operation of the comparator CP1. Accordingly, the invalid data D1 output from the comparator CP1 after the auto-zero operation and the indefinite data D2 output from the comparator CP1 prior to the invalid data D1 are not provided to the encoder 12. The indefinite data D2 is caused by switching noise which occurs during transition of the respective comparator from the comparing operation to the auto-zero operation, or by the deficiency of hold time of the output latch circuit of each comparator.

After one cycle of the control signal CF from the auto-zero operation of the comparator CP1, the control signals C1 and CZ of the comparator CP2 go high. The comparator CP2 performs the auto-zero operation while inputting the reference voltage VR2. In synchronization with the initiation of the auto-zero operation, the control signal S2 goes low, and the control signal S1 goes high. As a result, in place of the signal Q2, the signal Q1 output from the comparator CP1 is provided as a signal E1 to the encoder 12. That is, the comparators CP1, CP3 and CP4 output the comparison results. Accordingly, the invalid data D1 output at the time of auto-zero operation and the indefinite data D2 output from the comparator CP2 prior to the invalid data D1 are not provided to the encoder 12.

After the lapse of one cycle of the control signal CF from the auto-zero operation of the comparator CP2, the control signals C1 and CZ of the comparator CP3 go high. The comparator CP3 performs the auto-zero operation while inputting the reference voltage VR3. In synchronization with the initiation of the auto-zero operation, the control signal S4 goes low, and the control signal S3 goes high. As a result, in place of the signal Q3, the signal Q2 output from the comparator CP2 is provided as the signal E2 to the encoder 12. That is, the comparators CP1, CP2 and CP4 output the comparison results. Accordingly, the invalid data D1 output at the time of auto-zero operation and the indefinite data D2 output from the comparator CP3 prior to the invalid data D1 are not provided to the encoder 12.

After the lapse of one cycle of the control signal CF from the auto-zero operation of the comparator CP3, the control signals C1 and CZ of the comparator CP4 go high. The comparator CP4 performs the auto-zero operation while inputting the reference voltage VRH. In synchronization with the initiation of the auto-zero operation, the control signal S6 goes low, and the control signal S5 goes high. As a result, in place of the signal Q4, the signal Q3 output from the comparator CP3 is provided as the signal E3 to the encoder 12. That is, the comparators CP1, CP2 and CP3 output the comparison results.

Subsequently, after the lapse of one cycle of the control signal CF from the auto-zero operation of the comparator CP4, the control signals C2 and CZ of the comparator CP4 go high again. The comparator CP4 performs the auto-zero operation while inputting the reference voltage VR3. Accordingly, the invalid data D1 output from the comparator CP4 at the time of auto-zero operation and the indefinite data D2 output from the comparator CP4 prior to the invalid data D1 are not provided to the encoder 12.

In the second embodiment, during two cycles of the control signal CF after the auto-zero operation, a signal output from the comparator is not provided to the encoder 12. Therefore, invalid data D1 immediately after the auto-zero operation and indefinite data D2 output prior to the invalid data D1 during the auto-zero operation are not provided to the encoder 12.

(Third Embodiment)

The analog-to-digital converter 100 may also be operated according to a third embodiment of the present invention. In the third embodiment, the comparators CP1 to CP4 are selected by the control signals S1 to S6 produced in accordance with the clock signal HK high after the leading edge of the clock signal HCK and the clock signal low prior to the trailing edge of the clock signal HCK.

In the third embodiment, the comparators CP1 to CP4 perform the auto-zero operations in every two cycles of the control signal CF. The control signals S1 to S6 are controlled to prevent the invalid data D1 during the auto-zero operation of a first comparator and indefinite data D2 output subsequent to the invalid data D1 from being provided to the encoder 12 and to prevent invalid data D1 during the auto-zero operation of a second comparator subsequent to the first comparator and indefinite data D2 output prior to the invalid data D1 from being provided to the encoder. In the third embodiment, the invalid data D1 immediately after an auto-zero operation and indefinite data D2 before and after the invalid data are not provided to the encoder 12.

(Fourth Embodiment)

Figure 10:
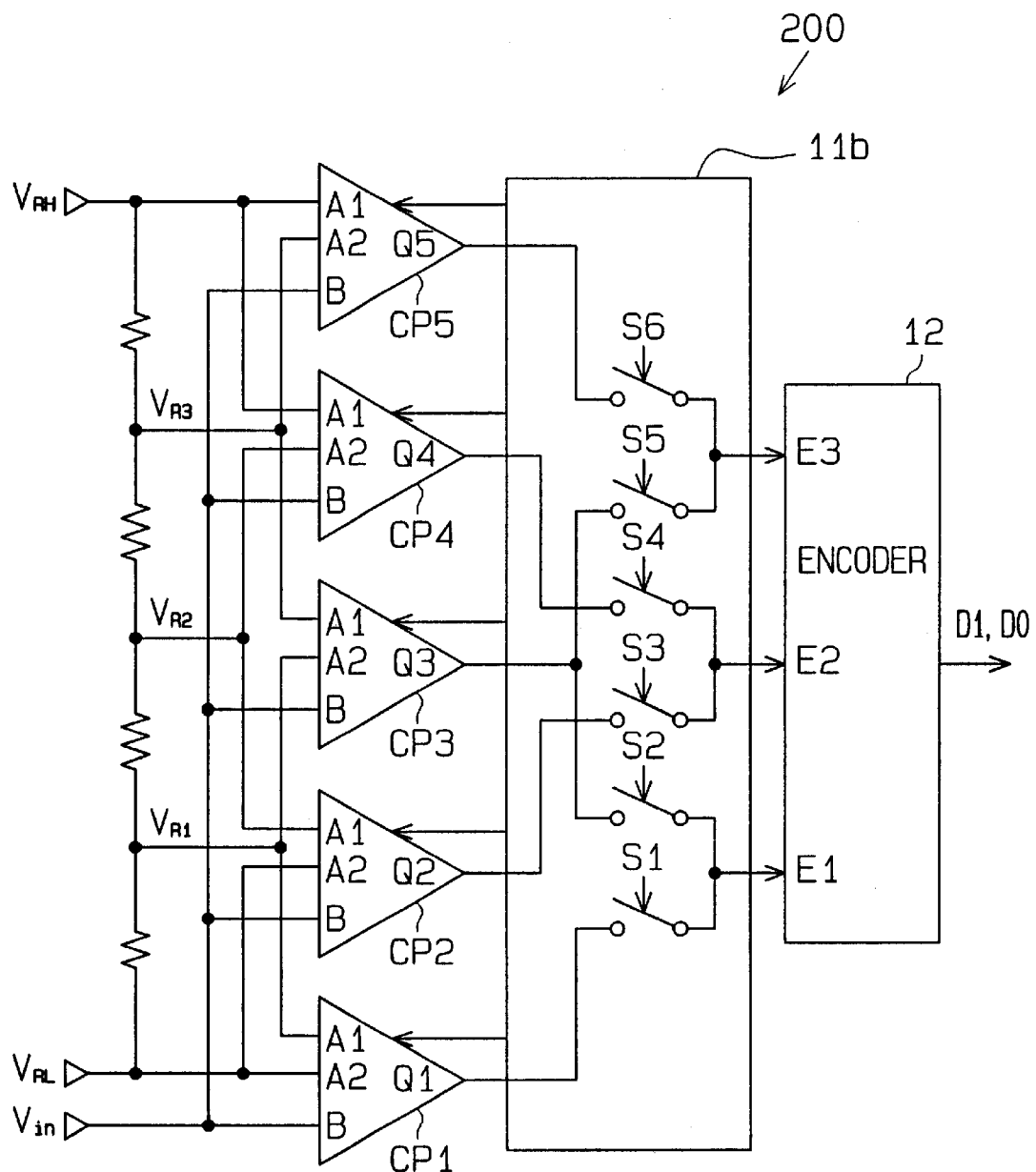
FIG. 10 is a circuit diagram of an analog-to-digital converter according to a fourth embodiment of the present invention.

FIG. 10 is a schematic diagram of an analog-to-digital converter 200 according to a fourth embodiment of the present invention. The analog-to-digital converter 200 comprises five chopper comparators CP1 to CP5 used to produce two digital output signals D0 and D1, a control section 11b and the encoder 12. The analog input signal Vin is input to an input terminal B of each of the comparators CP1 to CP5.

In the comparator CP1, the input terminal A1 receives the reference voltage VR1, and the input terminal A2 receives the reference voltage VRL. In the comparator CP2, the input terminal A1 receives the reference voltage VR2, and the input terminal A2 receives the reference voltage VRL. In the comparator CP3, the input terminal A1 receives the reference voltage VR3, and the input terminal A2 receives the reference voltage VR1. In the comparator CP4, the input terminal A1 receives the reference voltage VRH, and the input terminal A2 receives the reference voltage VR3.

In response to a control signal S1 output from the control section 11b, the signal Q1 output from the comparator CP1 is selected to be input as the signal E1 into the encoder 12. In response to the control signal S3, the signal Q2 output from the comparator CP2 is selected to be input as the signal E2 into the encoder 12. In response to the control signals S2 and S5, the signal Q3 output from the comparator CP3 is selected to be input as the signal E1 or E3 into the encoder 12. In response to the control signal S4, the signal Q4 output from the comparator CP4 is selected to be input as the signal E2 into the encoder 12. In response to the control signal S6, the signal Q5 output from the comparator CP5 is selected to be input as the signal E3 into the encoder 12.

Figure 27:
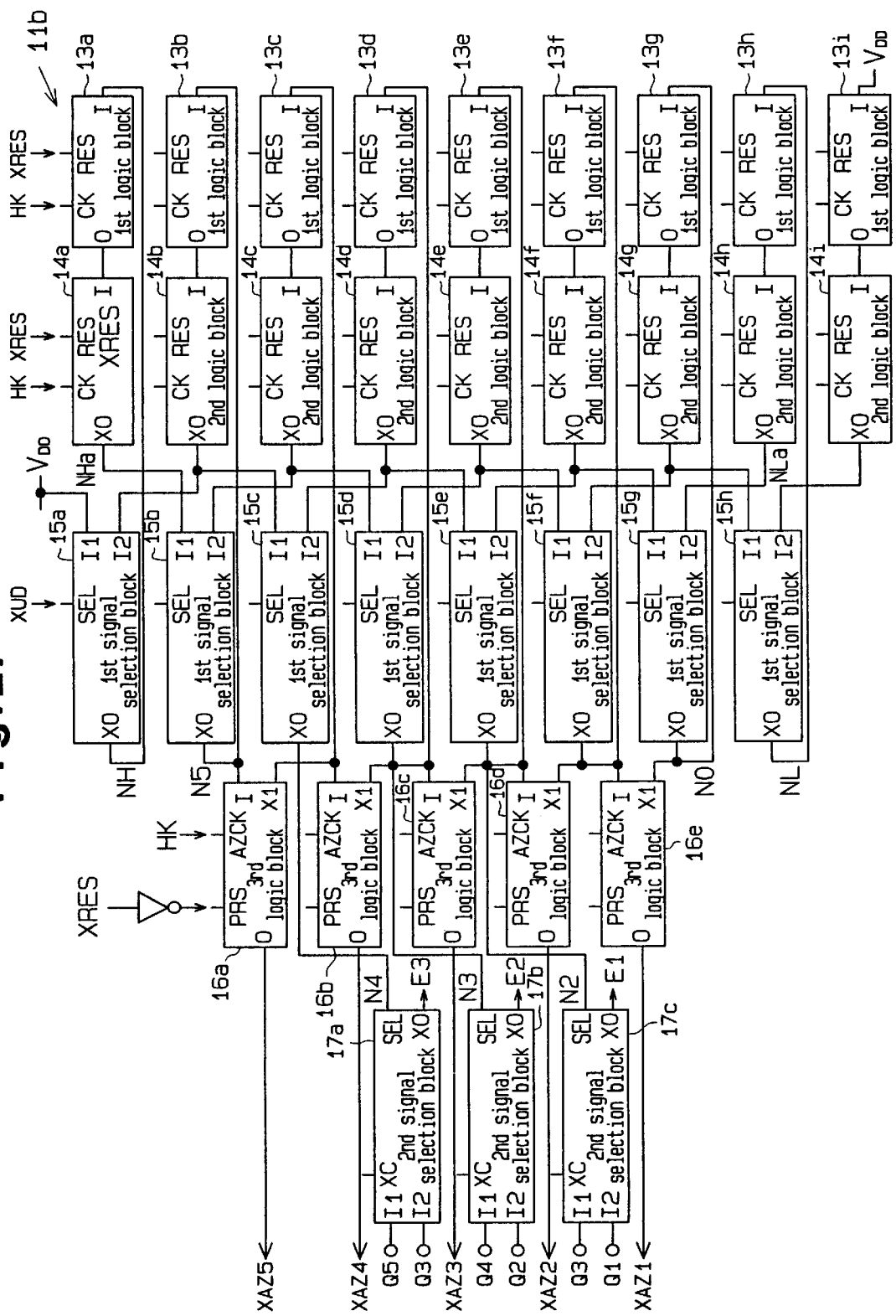
FIG. 27 is a block diagram of the control section according to the fourth embodiment of the present invention.
Figure 28:
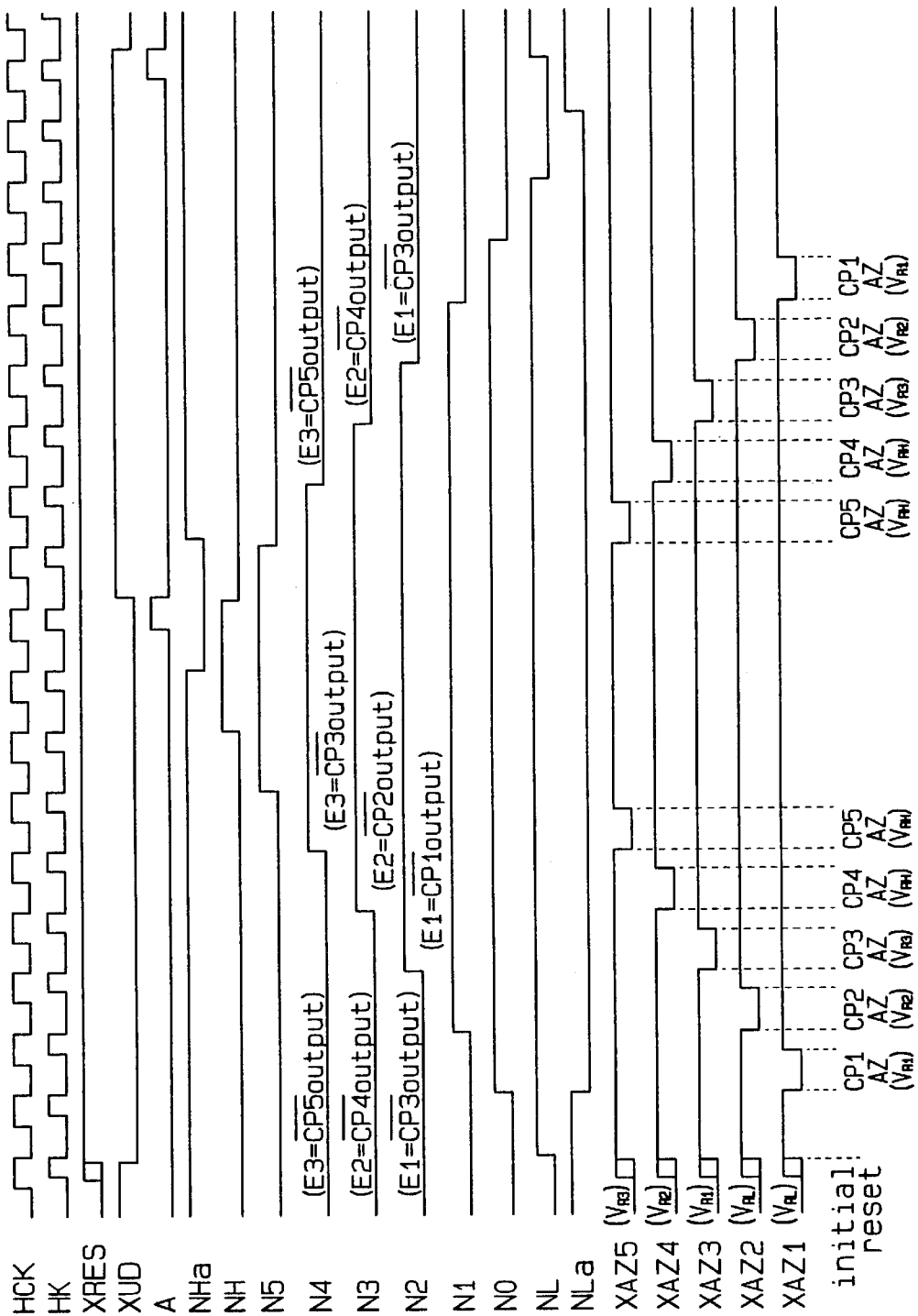
FIG. 28 is a timing chart of the operation of the control section of in FIG. 27.

FIG. 27 is a block diagram of the control section 11b of the fourth embodiment. The control section 11b comprises nine first logic blocks 13a to 13i, nine second logic blocks 14a to 14i, eight first signal selection blocks 15a to 15h, and five third logic blocks 16a to 16e. The signals N2 to N4 output from the first signal selection blocks 15c to 15e are provided to the second signal selection blocks 17a to 17c, which perform the selecting operations by the control signals S1 to S6.

Figure 11:
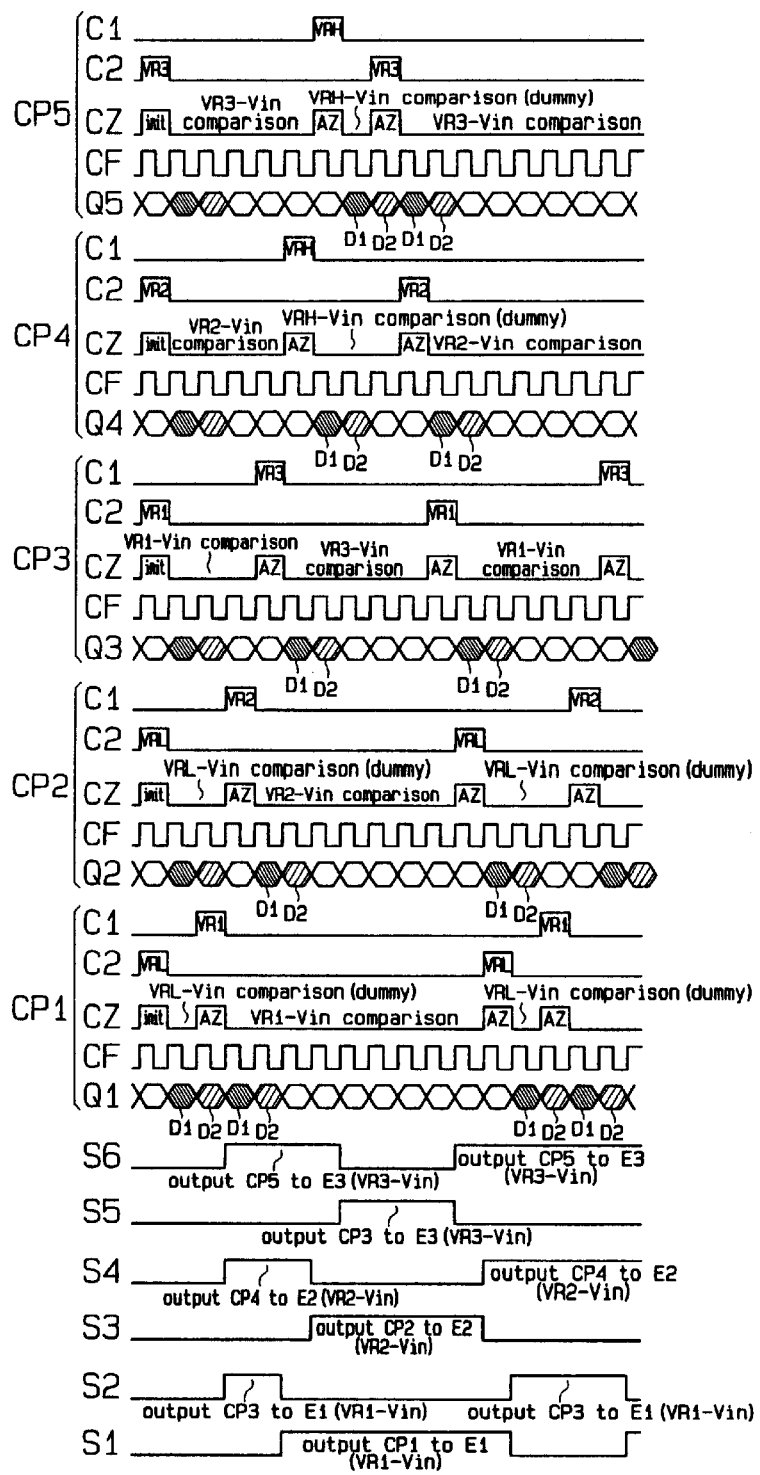
FIG. 11 is a timing chart of the operation of the analog-to-digital converter according to the fourth embodiment.

With reference to FIG. 11, the operations of the comparators CP1 to CP5 of the fourth embodiment will be described. The control signal CF is a clock signal CLK supplied to each of the comparators CP1 to CP5 from the control section 11b. The control signals S1 to S6 are produced by causing the clock signal HK to rise prior to the leading edge of the clock signal HCK.

When the control section 11b is started, the comparators CP1 to CP5 are respectively initialized. That is, when the control signals C2 and CZ go high, the comparator CP1 performs an auto-zero operation while inputting the reference voltage VRL. The comparator CP2 performs an auto-zero operation while inputting the reference voltage VRL. The comparator CP3 performs an auto-zero operation while inputting the reference voltage VR1. The comparator CP4 performs an auto-zero operation while inputting the reference voltage VR2. The comparator CP5 performs an auto-zero operation while inputting the reference voltage VR3.

Subsequently, when the control signal CZ goes low, each of the comparators CP1 to CP5 commences a comparing operation. At this time, the control signals S1 to S6 are maintained in a low state, thereby preventing the comparators CP1 to CP5 from outputting signals Q1 to Q5 to the encoder 12.

After one cycle of the control signal CF, the control signals C1 and CZ of the comparator CP1 go high. The comparator CP1 performs the auto-zero operation while inputting the reference voltage VR1. Next, after the completion of the auto-zero operation of the comparator CP1, the control signals S2, S4, and S6 go high. As a result, the signals Q3, Q4, and Q5 are provided to the encoder 12 from the comparators CP3, CP4, and CP5. At this time, the comparator CP3 outputs the comparison result of the reference voltage VR1 and the analog input signal Vin. The comparator CP4 outputs the comparison result of the reference voltage VR2 and the analog input signal Vin. The comparator CP5 outputs the comparison result of the reference voltage VR3 and the analog input signal Vin. After the auto-zero operation of the comparator CP1, the state is maintained during two cycles of the control signal CF. Accordingly, the invalid data D1 and indefinite data D2 output from the comparator CP1 after the auto-zero operation is not provided to the encoder 12.

After the comparator CP1 has completed the auto-zero operation, the control signals C1 and CZ of the comparator CP2 go high substantially simultaneously with the leading edge of the next control signal CF. The comparator CP2 then performs the auto-zero operation while inputting the reference voltage VR2. In this state, there are no substantial changes in the control signals S1 to S6, and the comparator CP1 is performing a comparing operation. However, the signal Q1 output from the comparator CP1 is not provided to the encoder 12.

After a lapse of one cycle of the control signal CF from the auto-zero operation of the comparator CP2, the control signal S2 goes low, and the control signal S1 goes high. As a result, in place of the signal Q3, the signal Q1 output from the comparator CP1 is provided as the signal E1 to the encoder 12. That is, the comparators CP1, CP4 and CP5 output the comparison results. Accordingly, the invalid data D1 and the indefinite data D2 output from the comparator CP2 after the auto-zero operation is not provided to the encoder 12.

After the comparator CP2 has completed the auto-zero operation, the control signals C1 and CZ of the comparator CP3 go high substantially simultaneously with the leading edge of the next control signal CF. The comparator CP3 then performs the auto-zero operation while inputting the reference voltage VR3. After the lapse of one cycle of the control signal CF after the auto-zero operation of the comparator CP3, the control signal S4 goes low, and the control signal S3 goes high. As a result, the signal Q2 output from the comparator CP2 is provided as the signal E2 to the encoder 12. That is, the comparators CP1, CP2 and CP5 output the comparison results Accordingly, the invalid data D1 and the indefinite data D2 output from the comparator CP3 after the auto-zero operation is not provided to the encoder 12.

After the comparator CP3 has completed the auto-zero operation, the control signals C1 and CZ of the comparator CP4 go high substantially simultaneously with the leading edge of the next control signal CF. The comparator CP4 then performs the auto-zero operation while inputting the reference voltage VRH. Next, after the lapse of one cycle of the control signal CF from the auto-zero operation of the comparator CP4, the control signal S6 goes low, and the control signal S5 goes high. As a result, in place of the signal Q5, the signal Q3 output from the comparator CP3 is provided as the signal E3 to the encoder 12. That is, the comparators CP1, CP2 and CP3 output the comparison results. Accordingly, the invalid data D1 and the indefinite data D2 output from the comparator CP4 after the auto-zero operation is not provided to the encoder 12.

After the comparator CP4 has completed the auto-zero operation, the control signals C1 and CZ of the comparator CP5 go high simultaneously with the leading edge of the next control signal CF. The comparator CP5 then performs the auto-zero operation while inputting the reference voltage VRH. Next, after the lapse of one cycle of the control signal CF from the auto-zero operation of the comparator CP5, the control signals C2 and CZ of the comparator CP5 go high. The comparator CP5 then performs the auto-zero operation while inputting the reference voltage VR3. At this time, since there are no substantial changes in the control signals S1 to S6, the signals Q1 to Q3 are provided to the encoder 12 without interruption.

Next, after the comparator CP5 has completed the auto-zero operation, the control signals C2 and CZ of the comparator CP4 go high substantially simultaneously with the leading edge of the next control signal CF. The comparator CP4 then performs the auto-zero operation while inputting the reference voltage VR2. At this time, since there are no substantial changes in the control signals S1 to S6, the signals Q1 to Q3 are provided to the encoder 12 without interruption. Accordingly, the invalid data D1 and the indefinite data D2 output from the comparator CP5 after the auto-zero operation is not provided to the encoder 12.

After the comparator CP4 has completed the auto-zero operation based on the reference voltage VR2, the control signals C2 and CZ of the comparator CP3 go high substantially simultaneously with the leading edge of the next control signal CF. The comparator CP3 then performs the auto-zero operation while inputting the reference voltage VR1. Substantially simultaneously with the completion of the auto-zero operation, the control signal S6 goes high, and the control signal S5 goes low. As a result, in place of the signal Q3, the signal Q5 is provided as the signal E3 to the encoder 12. Further, the signals Q1 and Q2 are provided as the signals E1 and E2 to the encoder 12 without interruption. Accordingly, the invalid data D1 and the indefinite data D2 output from the comparator CP4 after the auto-zero operation is not provided to the encoder 12.

In the fourth embodiment, during two cycles of the control signal CF after the auto-zero operation, the signal output from the comparator that has performed the auto-zero operation is switched to a signal output from another comparator which is performing the comparing operation at the same reference voltage. Therefore, invalid data D1 and indefinite data D2 immediately after the auto-zero operation are not provided to the encoder 12. Furthermore, When the comparators CP1 to CP5 perform the auto-zero operation in turn at each rising edge of the control signal CF, the three comparators, which performs comparison operation in a stable state, are selected, the remaining one of two unselected comparators performs an auto-zero operation, and the remaining another one of two unselected comparators outputs invalid data and indefinite data. Accordingly, the speed of analog-to-digital conversion is increased.

(Fifth Embodiment)

Figure 12:
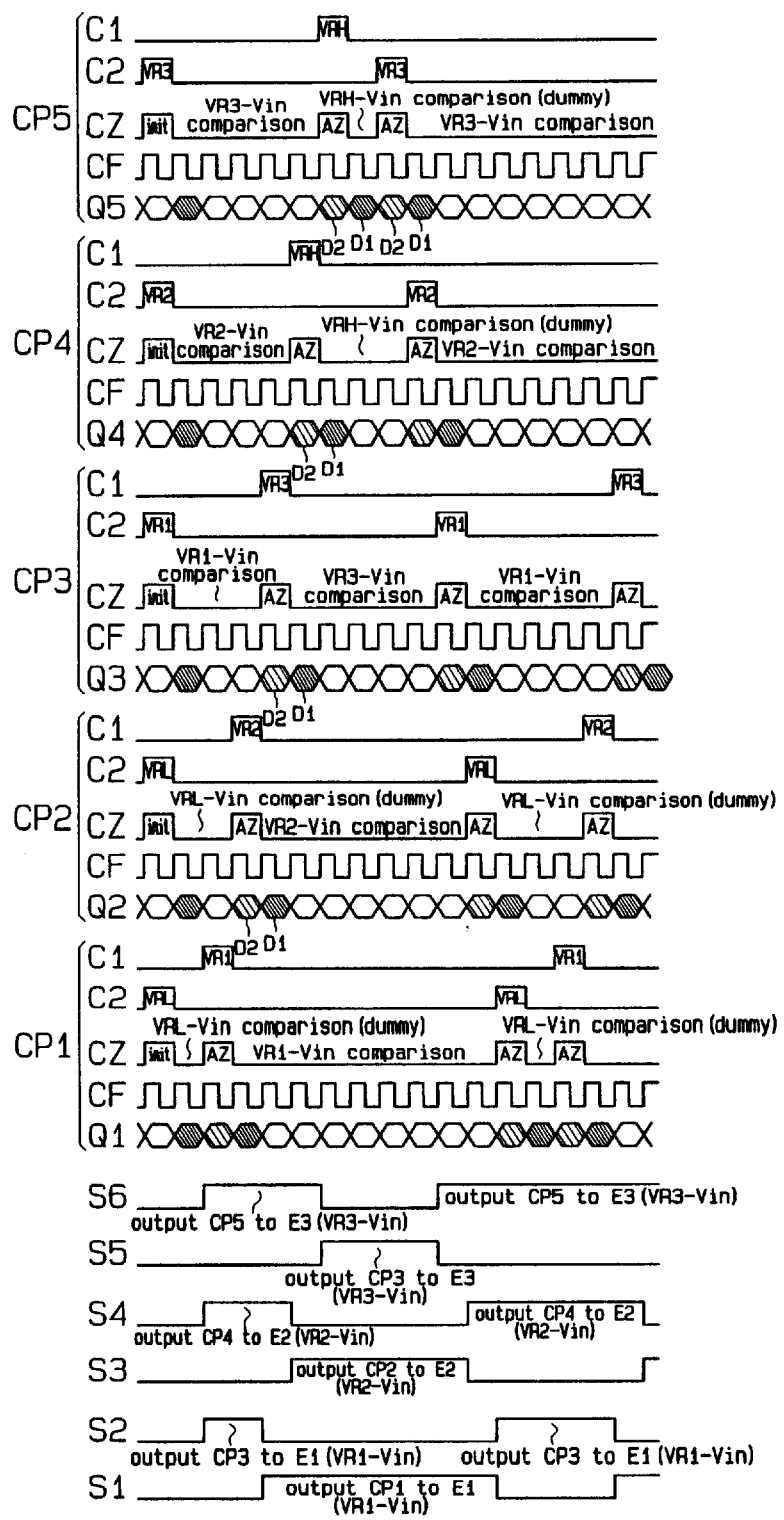
FIG. 12 is a timing chart of the operation of an analog-to-digital converter according to a fifth embodiment.

FIG. 12 is a timing diagram showing the operation of the analog-to-digital converter 200 operating according to a fifth embodiment of the present invention. The operation of the analog-to-digital converter 200 according to the fifth embodiment is modified from the fourth embodiment in the timing at which the auto-zero operations are performed, as well as in the timing at which the signals Q1 to Q5 are selected by the control signals S1 to S6. The control signals Si to S6 are produced in accordance with the control section 11b. The clock signals HK and HCK are produced in accordance with the clock signal HK low after the trailing edge of the clock signal HCK.

In FIG. 12, the timing at which each of the comparators CP1 to CP5 performs the auto-zero operation is the same as the fourth embodiment. However, the control signals S1 to S6 of the fifth embodiment are switched earlier than the fourth embodiment by one cycle of the control signal CF. During two cycles of the control signal CF from the commence of the auto-zero operation, the signal output from the comparator that has performed the auto-zero operation is switched to a signal output from another comparator which is performing the comparing operation at the same reference voltage. Therefore, invalid data D1 and indefinite data D2 output prior to the invalid data D1 during the auto-zero operation are not provided to the encoder 12.

(Sixth Embodiment)

Figure 13:
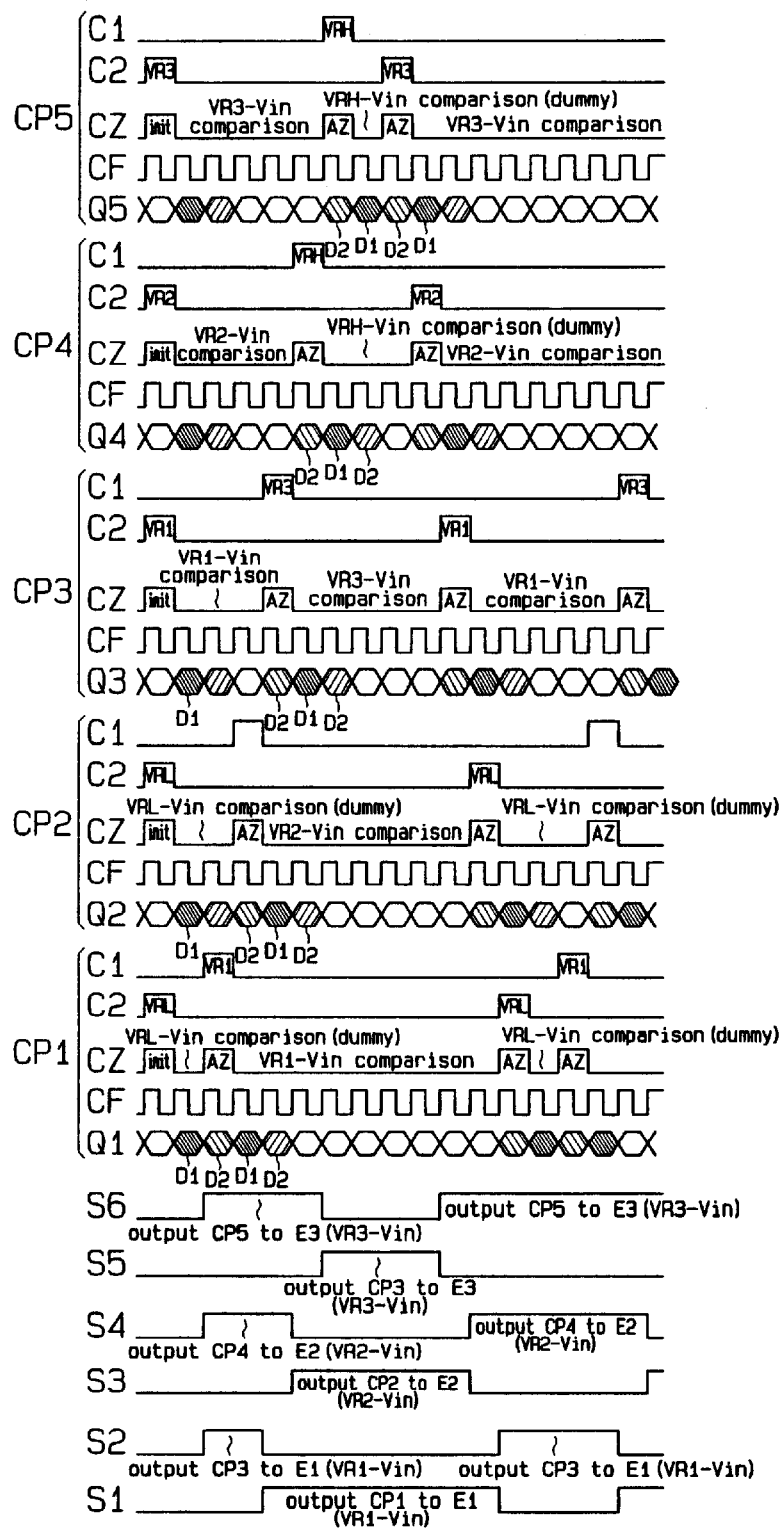
FIG. 13 is a timing chart of the operation of an analog-to-digital converter according to a sixth embodiment.

FIG. 13 shows the operation of the analog-to-digital converter 200 operating according to a sixth embodiment of the present invention. The operation of the analog-to-digital converter 200 according to the sixth embodiment is modified from the operation of the fourth embodiment in the timing at which the auto-zero operations are performed, as well as in the timing at which the signals Q1 to Q5 are selected by the control signals S1 to S6. The control signals S1 to S6 are produced in accordance with the clock signal HK low after the trailing edge of the clock signal HCK and the clock signal HK high prior to the leading edge of the clock signal HCK. The timing at which each of the comparators CP1 to CP5 performs the auto-zero operation is the same as that the fourth embodiment. The control signals S1 to S6 of the sixth embodiment are switched by delaying the timing of the leading edges of the control signals S1, S3 and S5 and the trailing edges of the control signals S2, S4 and S6 according to the fifth embodiment by one cycle of the control signal CF.

In the six embodiment, the invalid data D1 output from the comparator immediately after the auto-zero operation and indefinite data D2 output before and after the invalid data D1 are not provided to the encoder 12.

(Seventh Embodiment)

Figure 14:
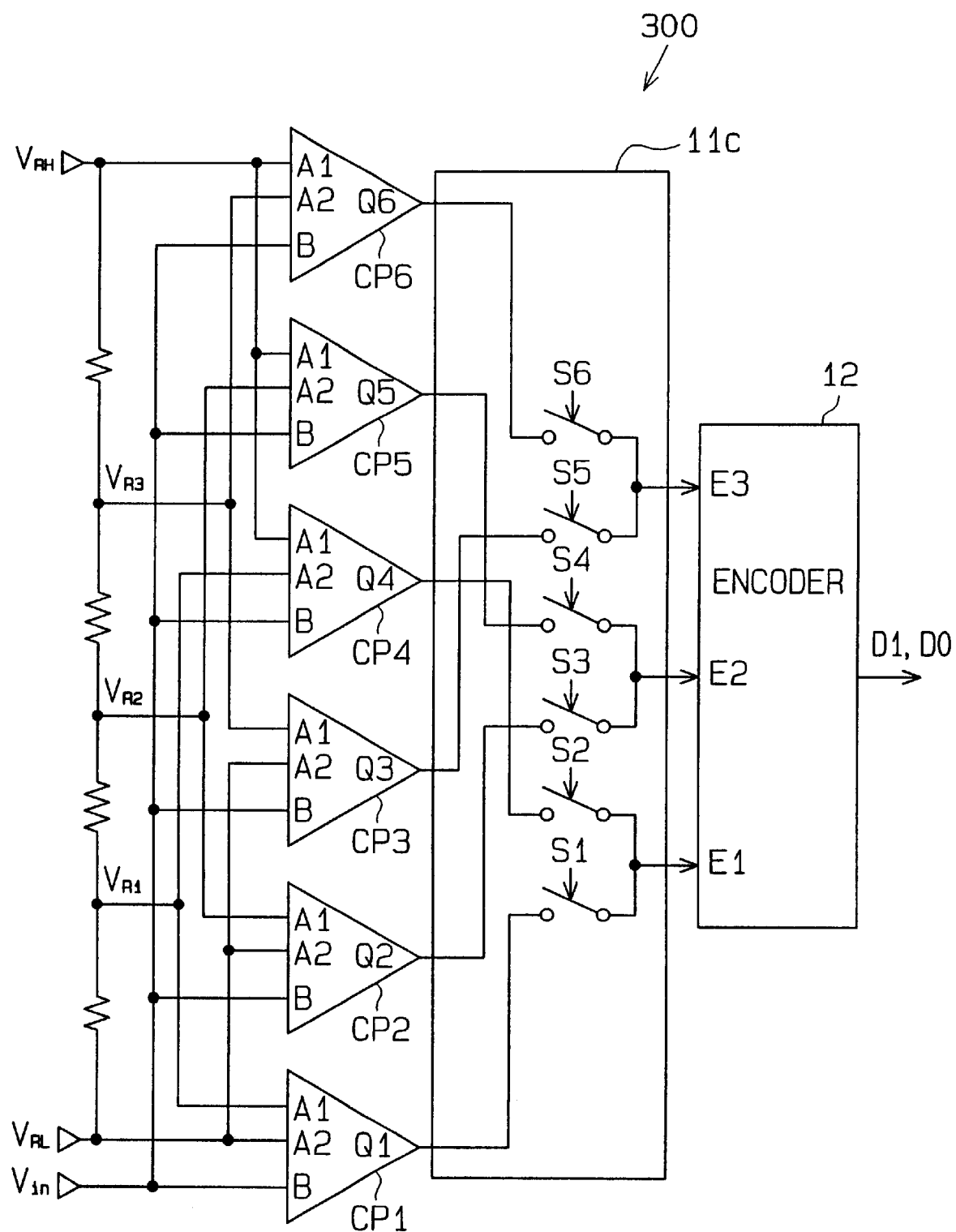
FIG. 14 is a circuit diagram of an analog-to-digital converter according to a seventh embodiment of the present invention.

FIG. 14 is a circuit diagram of an analog-to-digital converter 300 according to a seventh embodiment of the present invention. The analog-to-digital converter 300 comprises six chopper comparators CP1 to CP6 used to produce two digital output signals D0 and D.

The analog input signal Vin is input to an input terminal B of each of the comparators CP1 to CP6. In the comparator CP1, the input terminal A1 receives the reference voltage VR1, and the input terminal A2 receives the reference voltage VRL. In the comparator CP2, the input terminal A1 receives the reference voltage VR2, and the input terminal A2 receives the reference voltage VRL. In the comparator CP3, the input terminal A1 receives the reference voltage VR3, and the input terminal A2 receives the reference voltage VR1. In the comparator CP4, the input terminal A1 receives the reference voltage VRH, and the input terminal A2 receives the reference voltage VR3. In the comparator CP5, the input terminal A1 receives the reference voltage VRH, and the input terminal A2 receives the reference voltage VR2. In the comparator CP6, the input terminal A1 receives the reference voltage VRH, and the input terminal A2 receives the reference voltage VR3.

In response to the control signal S1, the signal Q1 output from the comparator CP1 is selected to be input as the signal E1 into the encoder 12. In response to the control signal S3, the signal Q2 output from the comparator CP2 is selected to be input as the signal E2 into the encoder 12. In response to the control signal S5, the signal Q3 output from the comparator CP3 is selected to be input as the signal E3 into the encoder 12. In response to the control signal S2, the signal Q4 output from the comparator CP4 is selected to be input as the signal E1 into the encoder 12. In response to the control signal S4, the signal Q5 output from the comparator CP5 is selected to be input as the signal E2 into the encoder 12. In response to the control signal S6, the signal Q6 output from the comparator CP6 is selected to be input as the signal E3 into the encoder 12.

Figure 15:
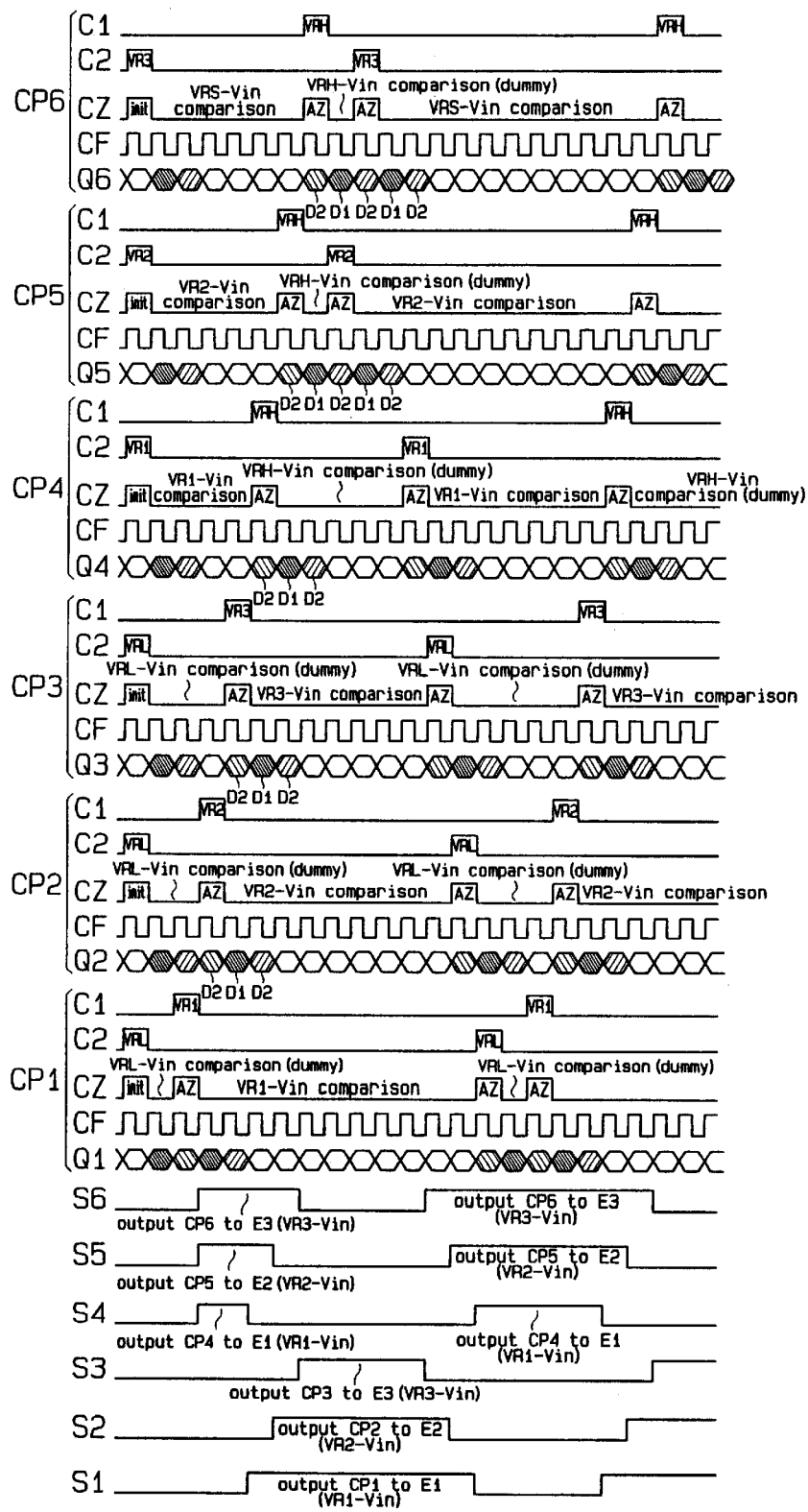
FIG. 15 is a timing chart of the operation of the analog-to-digital converter according to the seventh embodiment.

FIG. 15 shows the operation of the analog-to-digital converter 300 of the seventh embodiment. Of the control signals S1 to S6, with the exception of an initial operation, the control signals S1 and S4 are complementary to each other; the control signals S2 and S5 are complementary to each other; and the control signals S3 and S6 are complementary to each other. The comparators CP1 to CP6 perform the auto-zero operation in turn on in response to the control signals C1, C2, and CZ at each leading edge of the control signal CF.

In the seventh embodiment, invalid data D1 immediately after the auto-zero operation and indefinite data D2 output before and after the invalid data D1 are not provided to the encoder 12.

Furthermore, when the comparators CP1 to CP6 perform the auto-zero operation in turn at each rising edge of the control signal CF, the three comparators which perform comparison operation in a stable state are selected, the remaining one of three unselected comparators performs an auto-zero operation, and the remaining two of three unselected comparators output invalid data and indefinite data. Accordingly, the speed of analog-to-digital conversion is increased.

(Eighth Embodiment)

Figure 29:
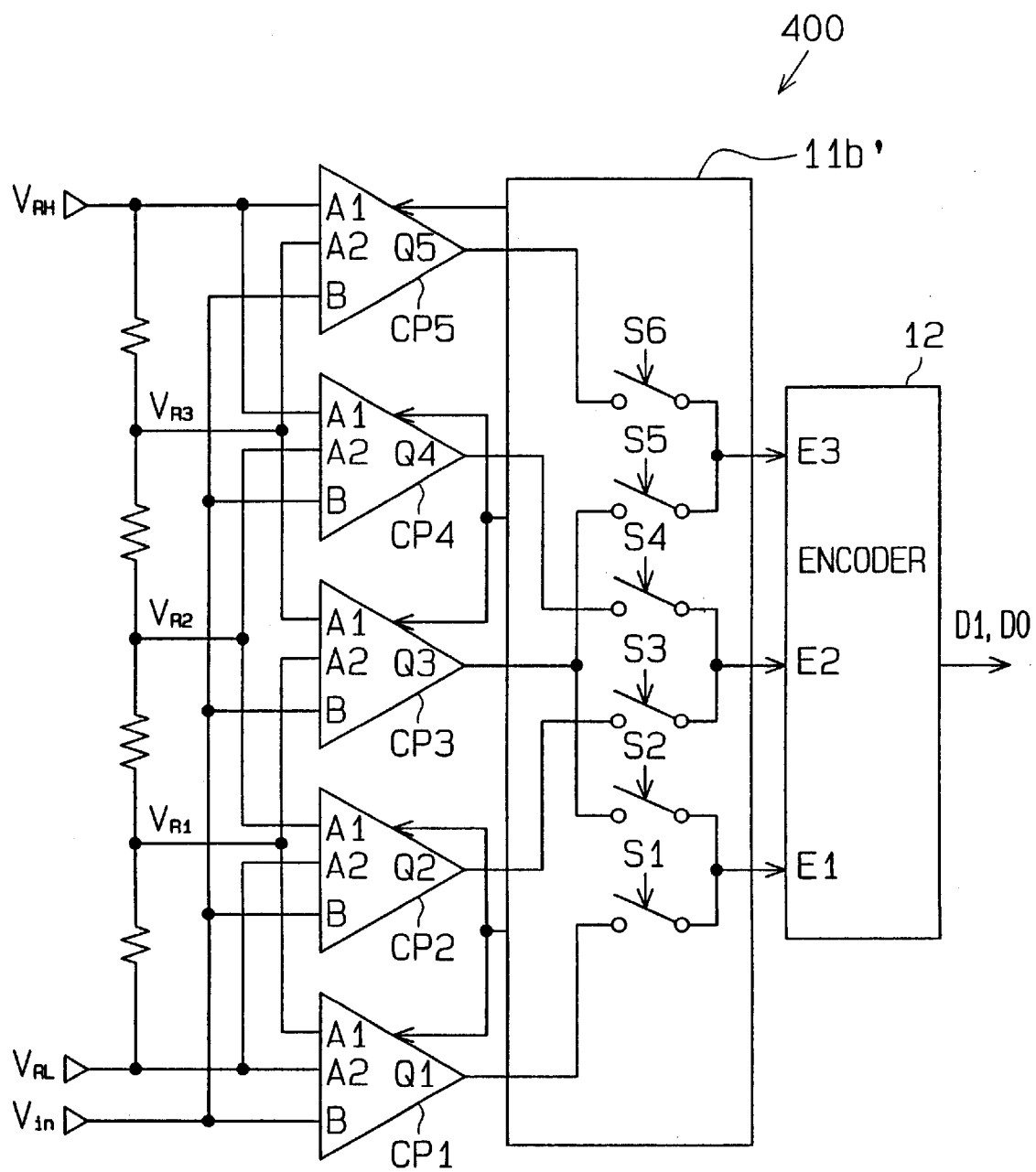
FIG. 29 is a circuit diagram of an analog-to-digital converter according to an eighth embodiment of the present invention.
Figure 30:
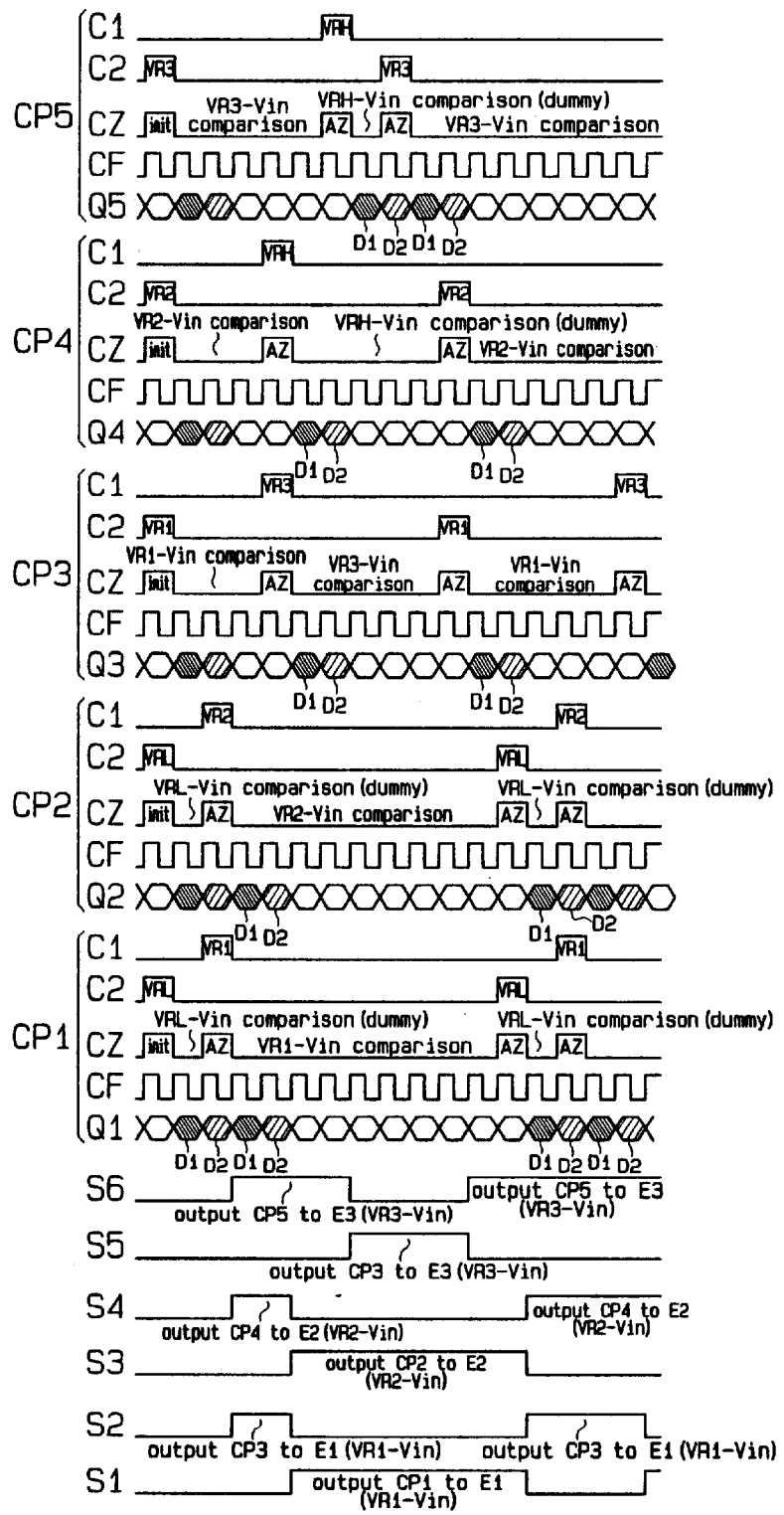
FIG. 30 is a timing chart of the operation of the analog-to-digital converter according to the eighth embodiment.

FIG. 29 is a circuit diagram of an analog-to-digital converter 400 according to an eighth embodiment of the present invention. The eighth embodiment is a modified version of the fourth embodiment of FIG. 10. In the eighth embodiment, the control section 11$b'$ provides a first control signal XAZ1 to the first and second comparators CP1 and CP2, a second control signal XAZ2 to the third and fourth comparators CP3 and CP4, and a third control signal XAZ3 to the fifth comparator CP5. Accordingly, the control section 11$b'$ has only three logic circuits for generating the first to third control signals XAZ1–XAZ3, so that reduction of a circuit area and power consumption of the converter 400 is achieved. In contrast, the control section 11$b$ of the fourth embodiment has five logic circuits for generating the first to fifth control signals XAZ1–XAZ5 for five comparators CP1–CP5.

FIG. 29 is a timing chart of the operation of the analog-to-digital converter 400 according to the eighth embodiment. The converter 400 operates such that when a pair of comparators performs an auto-zero operation, the remaining three comparators perform a comparison operation. For example, when a pair of comparators CP1 and CP2 perform an auto-zero operation, the remaining three comparators CP3–CP5 perform a comparison operation.

Since the number of the control signals of the eighth embodiment are less than the number of the control signals of the fourth embodiment, the maximum period of auto-zero operations of all of the comparators is shortened, so that the charging period of the capacitor of the comparator is narrowed. This allows the converter to be fully operated at a relatively low frequency.

The eighth embodiment may be applied to the seventh embodiment of FIG. 14. That is, the control section 11$b'$ provides a first control signal XAZ1 to the first to third comparators CP1–CP3 and a second control signal XAZ2 to the fourth to sixth comparators CP4–CP6. Accordingly, the control section has only two logic circuits for generating the first and second control signals XAZ1 and XAZ2. The converter of the eighth embodiment operates so that when three comparators perform an auto-zero operation, the remaining three comparators perform a comparison operation. For example, when three comparators CP1–CP3 perform an auto-zero operation, the remaining three comparators CP4–CP6 perform a comparison operation. Alternatively, when three comparators CP4–CP6 perform an auto-zero operation, the remaining three comparators CP1–CP3 perform a comparison operation.

It should be apparent to those skilled in the art that the present invention may be embodied in many other specific forms without departing from the spirit or scope of the invention. For example, the operation of the output latch circuit may be stopped at the time of the auto-zero operation by suspending the input of the control signal CF to the output latch circuit in accordance with the control signal CZ. In this case, an unnecessary operation of the output latch circuit during the auto-zero operation is stopped, the power consumption by the output latch circuit is reduced. Therefore, the present examples and embodiments are to be considered as illustrative and not restrictive and the invention is not to be limited to the details given herein, but may be modified within the scope and equivalence of the appended claims.

What is claimed is:

1. An analog-to-digital converter, comprising:
a plurality of chopper type comparators, each receiving a reference voltage and an analog voltage and performing an auto-zero operation for setting the reference voltage and a comparing operation for comparing the reference voltage set by the auto-zero operation with the analog voltage to output a comparison result signal, the comparing operation being performed a plurality of times subsequent to the auto-zero operation;
a controller circuit, coupled to the plurality of chopper type comparators, controlling one comparator to perform the auto-zero operation and the remaining comparators to perform the comparing operations, substantially simultaneously, the controller circuit selectively outputting the comparison result signals output from the remaining comparators; and
an encoder, coupled to the controller circuit, receiving the comparison result signals and generating a digital signal therefrom,
wherein said controller circuit includes a signal selector circuit for switching a first comparison result signal output from a first comparator performing the comparing operation before or after the auto-zero operation to a second comparison result signal output from a second comparator performing the comparing operation using the same reference voltage as the first comparator.

2. The analog-to-digital converter of claim 1, wherein said signal selector circuit switches, for a predetermined period of time, the first comparison result signal output from the first comparator performing the comparing operation following the auto-zero operation to a second comparison result signal output from the second comparator performing the comparing operation using the same reference voltage as the first comparator.

3. The analog-to-digital converter of claim 1, wherein said signal selector circuit switches, for a predetermined period of time, the first comparison result signal output from the first comparator performing the comparing operation prior to the auto-zero operation to a second comparison result signal output from the second comparator performing the comparing operation using the same reference voltage as the first comparator.

4. The analog-to-digital converter of claim 1, wherein said signal selector circuit switches, for a predetermined period of time, the first comparison result signal output from the first comparator performing the comparing operation prior to and following the auto-zero operation to a second comparison result signal output from the second comparator performing the comparing operation using the same reference voltage as the first comparator.

5. The analog-to-digital converter of claim 1, wherein the number of said comparators is set to a value obtained by adding one to a value (2n−1) that is necessary to produce an n-bit digital signal.

6. The analog-to-digital converter of claim 1, wherein the number of said comparators is set to a value obtained by adding two or more to a value (2n−1) that is necessary to produce an n-bit digital signal.

7. The analog-to-digital converter of claim 1, wherein each of said comparators includes an output latch circuit for latching the comparison result signal, and wherein said controller circuit disables the output latch circuit at the time of the auto-zero operation.

8. The analog-to-digital converter of claim 1, wherein a controller circuit controls at least two comparators to perform the auto-zero operation at a same operation period and the remaining comparators to perform the comparing operations.

9. An analog-to-digital (A/D) converter for converting an analog input signal into a digital signal, the converter comprising:

a plurality of chopper type comparators, each comparator receiving and comparing a reference voltage and the analog input signal to generate a comparator output signal and for performing an auto-zero operation to set the reference voltage;

a controller circuit connected to the plurality of comparators, the controller circuit causing a selected one of the comparators to perform the auto-zero operation and the remaining, nonselected comparators to perform the comparing operation, wherein one of the nonselected comparators performs its comparing operation using a same reference voltage set for the selected comparator by the auto-zero operation; and an encoder connected to the control circuit and the comparators for receiving the output signals from the nonselected comparators and for generating the digital signal therefrom, wherein the selected comparator does not provide its comparison output signal to the encoder for at least one cycle after completing the auto-zero operation.

10. The A/D converter of claim 9, wherein the selected comparator does not provide its comparison output signal to the encoder for at least two cycles after completing the auto-zero operation.

11. The A/D converter of claim 9, wherein each comparator includes an output latch circuit.

12. The A/D converter of claim 9, wherein one of the comparators is selected for performing the auto-zero operation every two cycles.

13. The A/D converter of claim 9, further comprising a voltage divider circuit connected to the plurality of comparators for generating the reference voltage signals.

14. The A/D converter of claim 9, wherein multiple comparators are substantially simultaneously selected to perform the auto-zero and an equal number of remaining multiple comparators perform the comparing operation.

15. An analog-to-digital (A/D) converter for converting an analog input signal into a digital signal, the converter comprising:

a plurality of chopper type comparators, each comparator receiving and comparing a reference voltage and the analog input signal to generate a comparator output signal and for performing an auto-zero operation to set the reference voltage;

a controller circuit connected to the plurality of comparators, the controller circuit causing a selected one of the comparators to perform the auto-zero operation and the remaining, nonselected comparators to perform the comparing operation, wherein one of the nonselected comparators performs its comparing operation using the same reference voltage set for the selected comparator by the auto-zero operation; and an encoder connected to the control circuit and the comparators for receiving the output signals from the nonselected comparators and generating the digital signal therefrom, wherein the selected comparator does not provide its comparison output signal to the encoder for at least two cycles after completing the auto-zero operation.

16. The A/D converter of claim 15, wherein each comparator includes an output latch circuit.

17. The A/D converter of claim 15, wherein one of the comparators is selected for performing the auto-zero operation every two cycles.

18. The A/D converter of claim 15, further comprising a voltage divider circuit connected to the plurality of comparators for generating the reference voltage signals.

19. The A/D converter of claim 15, wherein multiple comparators are substantially simultaneously selected to perform the auto-zero and an equal number of remaining multiple comparators perform the comparing operation.

* * * * *